US 6,583,972 B2

(12) United States Patent
Verhaege et al.

(10) Patent No.: US 6,583,972 B2
(45) Date of Patent: Jun. 24, 2003

(54) MULTI-FINGER CURRENT BALLASTING ESD PROTECTION CIRCUIT AND INTERLEAVED BALLASTING FOR ESD-SENSITIVE CIRCUITS

(75) Inventors: Koen Gerard Maria Verhaege, Gistel (BE); Markus Paul Josef Mergens, Plainsboro, NJ (US); Cornelius Christian Russ, Princeton, NJ (US); John Armer, Middlesex, NJ (US); Phillip Czeslaw Jozwiak, Plainsboro, NJ (US)

(73) Assignees: Sarnoff Corporation, Princeton, NJ (US); Sarnoff Europe, Gistel (BE)

( * ) Notice: Subject to any disclaimer, the term of this patent is extended or adjusted under 35 U.S.C. 154(b) by 82 days.

(21) Appl. No.: 09/881,422

(22) Filed: Jun. 14, 2001

(65) Prior Publication Data

US 2002/0033507 A1 Mar. 21, 2002

Related U.S. Application Data

(60) Provisional application No. 60/211,735, filed on Jun. 15, 2000, provisional application No. 60/214,513, filed on Jun. 28, 2000, provisional application No. 60/263,005, filed on Jan. 19, 2001, provisional application No. 60/272,159, filed on Feb. 28, 2001, provisional application No. 60/275,563, filed on Mar. 14, 2001, and provisional application No. 60/284,356, filed on Apr. 17, 2001.

(51) Int. Cl.$^7$ ................................................ H02H 9/00
(52) U.S. Cl. ...................................................... 361/56
(58) Field of Search ........................... 361/56, 58, 91.1, 361/91.2, 100, 101, 111; 257/241, 327, 337, 355, 358, 360

(56) References Cited

U.S. PATENT DOCUMENTS

| | | |
|---|---|---|
| 3,775,623 A | 11/1973 | Kamiyama et al. |
| 4,344,080 A | 8/1982 | Tihanyi |
| 4,423,431 A | 12/1983 | Sasaki |
| 4,763,184 A | 8/1988 | Krieger et al. |
| 5,140,401 A | 8/1992 | Ker et al. |
| 5,157,573 A | 10/1992 | Lee et al. |
| 5,208,475 A | 5/1993 | Mortensen |
| 5,248,892 A | 9/1993 | Van Roozendaal et al. |
| 5,301,084 A | 4/1994 | Miller |
| 5,404,041 A | 4/1995 | Diaz et al. |
| 5,450,267 A | 9/1995 | Diaz et al. |
| 5,468,667 A | 11/1995 | Diaz et al. |
| 5,477,413 A | 12/1995 | Watt |
| 5,477,414 A | 12/1995 | Li et al. |
| 5,497,285 A | 3/1996 | Nadd |
| 5,498,892 A | 3/1996 | Walker et al. |
| 5,510,728 A | 4/1996 | Huang |
| 5,519,242 A | 5/1996 | Avery |

(List continued on next page.)

OTHER PUBLICATIONS

PCT International Search Report, Oct. 24, 2001.

C. Duvvury et al., "Dynamic Gate Coupling of NMOS for Efficient Output ESD Protection", IEEE Electron Devices Society and the IEEE Reliability Society; Mar. 31, Apr. 1, 2, 1992.

*Primary Examiner*—Matthew Nguyen
(74) *Attorney, Agent, or Firm*—William J. Burke

(57) ABSTRACT

A multi-finger electro-static discharge (ESD) protection circuit has at least two first resistive channels defining input fingers. At least two field effect transistor (FET) channels, each having a drain and source are connected to corresponding ones of the at least two input fingers. The gate terminals of at least one of the at least two FETs are configured to be biased by an ESD potential applied to the drain electrodes to reduce the turn-on potential of the ESD device. At least two second resistive channels are connected between a corresponding one of the source terminals of the at least two FETs and a circuit return path.

43 Claims, 21 Drawing Sheets

U.S. PATENT DOCUMENTS

| | | |
|---|---|---|
| 5,568,345 A | 10/1996 | Mudd et al. |
| 5,600,525 A | 2/1997 | Avery |
| 5,631,793 A | 5/1997 | Ker et al. |
| 5,640,299 A | 6/1997 | Leach |
| 5,663,589 A | 9/1997 | Saitoh et al. |
| 5,689,133 A | 11/1997 | Li et al. |
| 5,701,024 A | 12/1997 | Watt |
| 5,708,550 A | 1/1998 | Avery |
| 5,721,445 A | 2/1998 | Singh et al. |
| 5,742,083 A | 4/1998 | Lin |
| 5,742,465 A | 4/1998 | Yu |
| 5,825,601 A | 10/1998 | Statz et al. |
| 5,831,316 A | 11/1998 | Yu et al. |
| 5,847,429 A | 12/1998 | Lien et al. |
| 5,959,488 A | 9/1999 | Lin et al. |
| 5,963,409 A * | 10/1999 | Chang .......................... 361/56 |
| 5,969,929 A | 10/1999 | Kleveland et al. |
| 5,977,594 A | 11/1999 | Takao |
| 5,985,722 A | 11/1999 | Kishi |
| 6,008,974 A | 12/1999 | Lee et al. |
| 6,021,071 A | 2/2000 | Otsuka |
| 6,031,704 A | 2/2000 | Jeong |
| 6,069,782 A | 5/2000 | Lien et al. |
| 6,072,682 A | 6/2000 | Ravanelli et al. |
| 6,091,592 A | 7/2000 | Sakurai |
| 6,097,235 A | 8/2000 | Hsu et al. |
| 6,118,154 A | 9/2000 | Yamaguchi et al. |
| 6,125,021 A | 9/2000 | Duvvury et al. |
| 6,191,633 B1 * | 2/2001 | Fujii et al. ................... 327/313 |
| 6,222,710 B1 | 4/2001 | Yamaguchi |

* cited by examiner

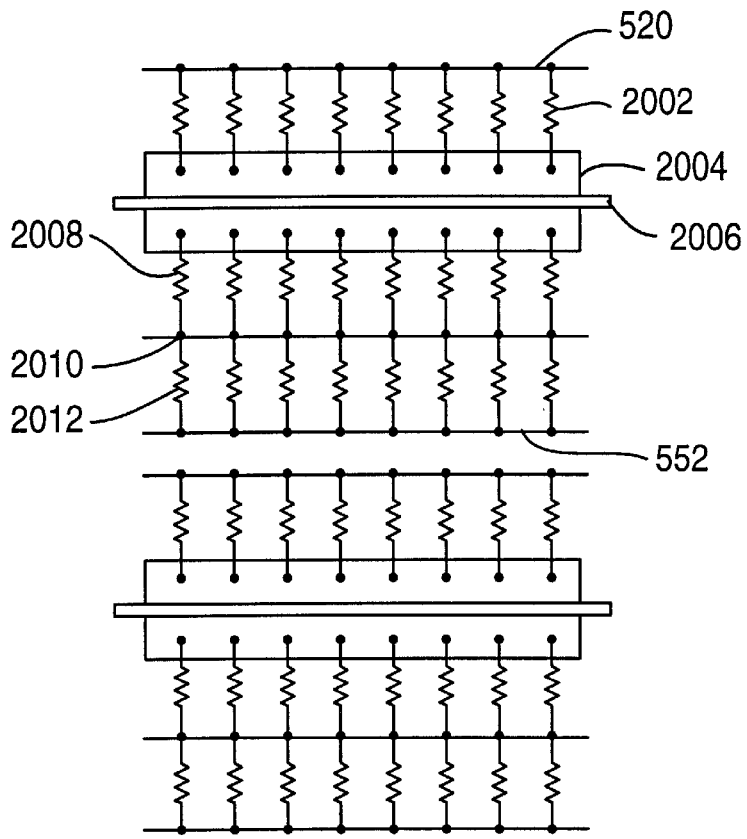
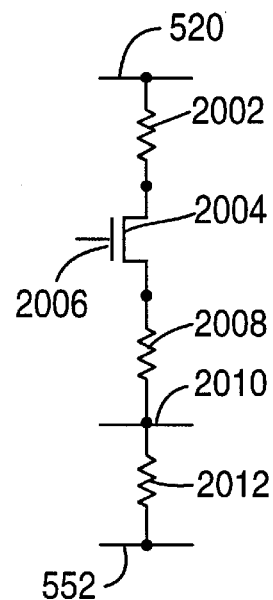
FIG. 20
FIG. 21
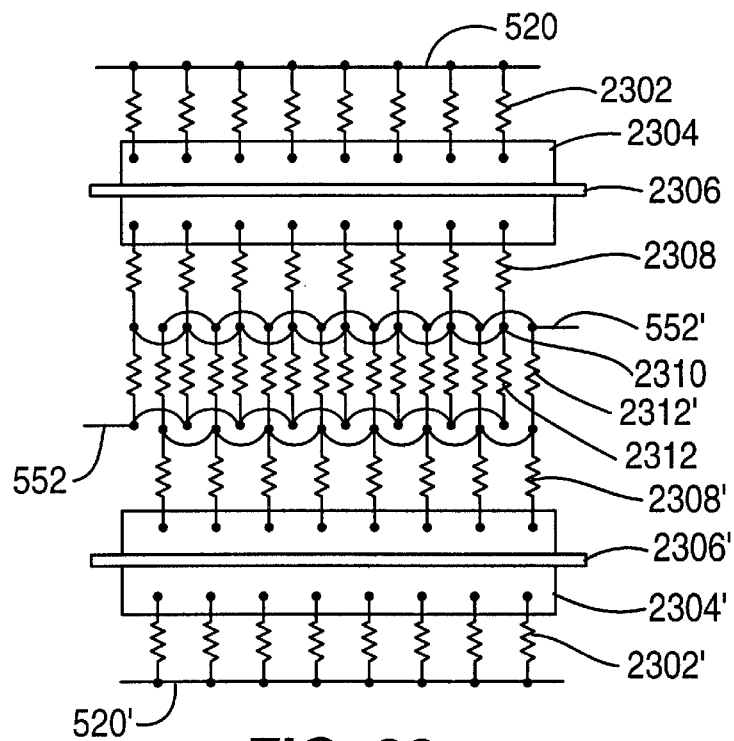
FIG. 23

MULTI-FINGER CURRENT BALLASTING ESD PROTECTION CIRCUIT AND INTERLEAVED BALLASTING FOR ESD-SENSITIVE CIRCUITS

CROSS-REFERENCES TO RELATED APPLICATIONS

This application claims the benefit of the filing date of provisional U.S. national application Nos. 60/211,735 filed on Jun. 15, 2000, 60/214,513 filed on Jun. 28, 2000, 60/263,005 filed on Jan. 19, 2001, 60/272,159 filed on Feb. 28, 2001, 60/275,563 filed on Mar. 14, 2001, Provisional Patent Application entitled FURTHER METHODS FOR CURRENT BALLASTING IN FULLY SILICIDED ESD PROTECTION DEVICES filed on Apr. 4, 2001 and 60/284,356 filed on Apr. 17, 2001 the entirety of which are incorporated herein by reference.

BACKGROUND OF THE INVENTION

The present invention relates to electrostatic discharge (ESD) protection, and, more particularly, to ESD protection circuits for reducing the voltage stress on integrated circuits during an ESD event.

Various types of circuits and other devices are vulnerable to damage from electrostatic discharge (ESD). ESD occurs when, for example, a user becomes electrostatically charged, for example by friction or induction and then discharges through a pin of the integrated circuit. Integrated circuits (ICs), particularly ICs formed of MOS (metal-oxide semiconductor) transistors, are especially vulnerable to such ESD damage. ESD may be inadvertently applied to input/output (I/O) or power pins or other pads of the IC, which can damage sensitive semiconductor junctions, dielectrics, interconnections or other sub-elements of the IC.

Various protection techniques have been developed to protect circuitry from ESD. The main goal of ESD protection is to shunt ESD-caused current away from vulnerable circuitry and through a special circuit path designed to handle such events at low voltages. Thus, the high voltage and current caused by an ESD event is diverted away from the main circuitry of the integrated circuit (IC). Such ESD circuits or structures (sometimes referred to as ESD protection circuits or clamps) may, for example, be placed in parallel across two input pins or pads, such as an I/O pad and ground, and therefore also in parallel across sensitive circuitry coupled to the two pads. Ideally, such ESD protection is unobtrusive or "invisible" to the normal operation of the circuit, so that its presence does not slow down or otherwise negatively impact the operation of the remaining IC circuitry when no ESD event is occurring.

Two commonly-used ESD protection structures are the SCR (silicon or semiconductor controlled rectifiers), and the npn bipolar transistor. Both types of structures exhibit a low-voltage, low-resistance state (known as the holding or clamping voltage) when a certain triggering voltage (or current) has been reached. Usually, the triggering voltage is higher than the holding voltage. Unless specifically designed otherwise, the SCR usually has the lowest holding voltage.

SCRs have been used, both parasitically and deliberately, to protect ICs, such as the SCR techniques described in U.S. Pat. Nos. 4,400,711, 4,405,933, 4,631,567 and 4,692,781. The major advantage of these SCR protection structures is their high energy-absorbing capability. Similarly, various forms of protection structures have been built around the npn snap-back phenomenon, such as the structures and techniques described in U.S. Pat. No. 5,519,242. This and similar structures take advantage of the parasitic npn bipolar junction transistor (BJT) existing in every NMOS transistor. Many of these approaches are now known as variants of the grounded-gate NMOS (ggNMOS).

Various problems have accompanied conventional ESD protection techniques. For example, large ESD protection device widths may be used to protect against large ESD events. In integrated circuit design, large device widths are achieved by using a multi-finger layout. A major concern with regard to multi-finger devices under ESD stress is the possibility of non-uniform triggering of the fingers. Curves 102 and 103 of FIG. 1 illustrate the behavior of a single parasitic BJT. When the voltage across the BJT exceeds $V_{t1}$, the BJT operates in a snapback mode to conduct current, thus, reducing the voltage across the protected circuitry. As shown by the curves 102 and 103 in FIG. 1, in order to ensure uniform turn-on of multi-finger structures, the voltage value at failure, $V_{t2}$, must exceed the triggering voltage $V_{t1}$ of the parasitic BJT transistor, i.e. the voltage at the onset of snapback. This ensures that a second parallel finger will trigger at around $V_{t1}$, before the first conducting finger reaches $V_{t2}$. Thus, damage to an initially triggered and first conducting finger can be avoided until adjacent fingers are also switched on into the low resistive ESD conduction state (i.e. snapback). To achieve the condition $V_{t1} < V_{t2}$ either the triggering voltage must be reduced or the second breakdown voltage must be increased.

Common methods to achieve the uniform conduction condition $V_{t1} < V_{t2}$ in NMOS transistors are gate coupling and substrate triggering, as shown by the curves 104 and 105 of FIG. 1. Gate coupling is described in an article by C. Duvvury et al. entitled "Dynamic Gate Coupling of NMOS for Efficient Output ESD Protection," IRPS 1992 (IEEE catalog number 92CH3084-1) pp. 141–150. These techniques typically employ a capacitor coupled between the drain and the gate of the MOS transistor. A portion of the current resulting from an ESD event is transmitted through the capacitor to transiently bias the parasitic bipolar junction transistor (BJT) which is inherent to the MOS device.

By transiently biasing the NMOS gate and/or the base of the BJT during an ESD event, the ESD trigger voltage $V_{t1}$ decreases to $V_{t1}'$, toward the snapback holding voltage $V_h$ intrinsically situated below $V_{t2}$. The transient biasing is designed to be present for a time interval sufficient to cause all parallel fingers to fully conduct the ESD current. The gate coupling and/or substrate triggering generally change the NMOS high current characteristic from the curves 102 and 103 to the curves 104 and 103. Moreover, these techniques also make it possible for NMOS transistors with a characteristic represented by curves 102 and 105, which may be inappropriate for ESD protection, to be modified to have a more appropriate characteristic represented by curves 104 and 105.

A general drawback of these methods, in particular with regard to radio frequency (RF) applications is the relatively large additional capacitance which is introduced at the I/O pads. Another drawback is the design complexity of the dynamic biasing circuitry which is typically designed to handle ESD events having many different time signatures.

One method for increasing $V_{t2}$ is to add ballasting resistance, e.g. by an increase of the drain contact to gate spacing in conjunction with silicide blocking as shown in FIG. 4A. However, the additional process steps for the local silicide blocking in semiconductor manufacturing are costly and known for yield losses. The fully silicided multi-finger NMOS device (FIGS. 4B and 4D) is susceptible to ESD currents because no ballasting resistance is available. The introduction of fully silicided regions (FIG. 4C) in the drain and source region leads to very large device dimensions without evidence of actual improvement of the ESD device performance. Again, additional capacitance is added in form of junction capacitance by the increased drain area.

A general drawback of adding ballast resistance is the increased holding voltage under high current conduction. This leads to a higher power dissipation and thus inherently to a lower ESD performance. This also leads to a higher voltage build-up across the protection device and, thus, across the protected circuit node. Another general drawback of adding ballast resistance is the reduction of NMOS drive current and speed for normal operating conditions.

It is therefore desirable for an ESD protection circuit or clamp to have a known multi-finger performance without using dynamic biasing and in implementations that do not add either additional capacitance or additional ballast resistance. Furthermore, it is desirable to have an ESD performance that varies as a linear function of the structure width.

SUMMARY OF THE INVENTION

The present invention is embodied in a multi-finger ESD protection circuit having at least two first resistive channels defining input fingers. First and second field effect transistors (FETs) each having drain, source and gate terminals are includes. Each of the first and second FETs defines a respective parasitic bipolar junction transistor (BJT) between the first and second circuit terminals. The base of the BJT corresponds to the channel region of the FET. The drain (collector) terminals of the first and second FETs are connected to a corresponding one of the at least two input fingers. The gate terminal of the first FET is connected to the gate terminal of the second FET.

In one aspect of the invention, the gate terminal of the first FET is coupled to the channel of the first FET and to the channel of the second FET.

In another aspect of the invention, the multi-finger ESD protection circuit further includes at least two second resistive channels connected between corresponding ones of the source (emitter) terminals of the at least two FETs and a source of reference potential.

In a further aspect of the invention, a multi-finger ESD protection is provided. The multi-finger circuit has a plurality of first resistive channels defining respective input fingers. A respective plurality of field effect transistors (FETs), including first, second and last FETs, each having drain, source and gate terminals, are included, the drain terminals of the plurality of FETs are connected to respective ones of the plurality of input fingers. Each of the plurality of FETs defines a respective parasitic bipolar junction transistor between the first and second circuit terminals. The gate terminal of the second FET is connected to the source terminal of the first FET and the gate terminal of the first FET is connected to the source terminal of the last FET. A respective plurality of second resistive channels are connected between a corresponding one of the source terminals of the plurality of FETs and a source of reference potential.

According to another aspect of the invention, a multi-finger ESD protection circuit is provided in which each FET has a channel region that corresponds to the base electrode of the parasitic bipolar transistor and the channel region of the second FET is coupled to the source terminal of the first FET.

In yet another aspect of the invention, the FET has a channel region that corresponds to the base electrode of the parasitic bipolar transistor and the gate terminal of the second FET is connected to the channel region of the second FET and to the source terminal of the first FET.

In yet another embodiment, a gate biasing circuit is provided in which a biasing circuit is operably linked to a plurality of parallel-connected FETs to simultaneously bias the plurality of FETs to uniformly distribute current flow between the first and second circuit terminals, among the plurality of FETs during an ESD event.

According to another aspect of the invention, the biasing circuit includes a further FET including gate, source and drain electrodes is configured with its source electrode coupled to the first circuit terminal and its drain electrode coupled to interconnected gate electrodes of the plurality of parallel-connected FETs. The circuit further includes a plurality of triggering FETs, each configured with a source electrode coupled to the second circuit terminal, a drain electrode coupled to the gate electrode of the further FET and gate electrode coupled to the source electrode of a respective one of the plurality of parallel connected FETs.

In still another embodiment, a diode gate coupling circuit is provided for discharging an ESD event. The diodes are connected so that an anode is connected to a source terminal of one of the FETs, the cathodes are connected to the gate electrode of a first and at least a second FET of the parallel-connected FETs.

In yet another embodiment, a triggering circuit is used to detect an ESD event and produce a detection signal. A transfer circuit is responsive to the detection signal of the triggering circuit for producing a bias signal.

In a further embodiment, a multi-finger ESD protection circuit is provided including a single plurality of parallel ballasting resistors. Each of the plurality of ballasting resistors has a first terminal coupled to the first circuit terminal and a second terminal coupled to respective drain electrodes of a plurality of FETs. The source terminals of the plurality of FETs are connected to the second circuit terminal.

BRIEF DESCRIPTION OF THE DRAWINGS

These and other features, aspects, and advantages of the present invention will become more fully apparent from the following description, appended claims, and accompanying drawings in which:

FIG. 20 is a top plan view, partially in schematic diagram form of an exemplary MFT structure.

FIG. 21 is a schematic diagram which is useful for describing the structure shown in FIG. 20.

FIG. 23 is a top plan view, partially in schematic diagram form of an exemplary area efficient MFT structure.

DESCRIPTION OF THE PREFERRED EMBODIMENT

The present invention is embodied in a multi-finger turn-on (MFT) ESD protection device in which, after a first transistor has been turned on by the ESD event, the remaining transistors are biased to turn on at a lower voltage than the turn-on voltage for the first transistor.

Although the present invention is described in terms of an ESD protection device for a complementary metal-oxide-semiconductor (CMOS) integrated circuit, it is contemplated that it may be applied in technologies other than CMOS-based ICs. For example, the present invention may also be employed to protect NMOS-based ICs or pure bipolar-based ICs. It may also be used as a trigger circuit for SCR-based protection circuits, as will be appreciated.

In MOS semiconductor processes, silicon ballasting resistance may be introduced to ensure equal current spreading and uniform multi-finger ESD performance (i.e., more than one MOSFET M). In some circuits, further trigger circuits are introduced to enhance multi-finger triggering and ESD performance. In the exemplary embodiments of the invention, trigger circuits are not used to uniformly trigger the multi-finger MOS circuit. In the embodiment, at least one transistor finger is allowed to trigger naturally. Here, from the partially conducting state, after the first finger is triggered, a bias signal is obtained to turn on the non-conducting transistor fingers.

Figure 1:
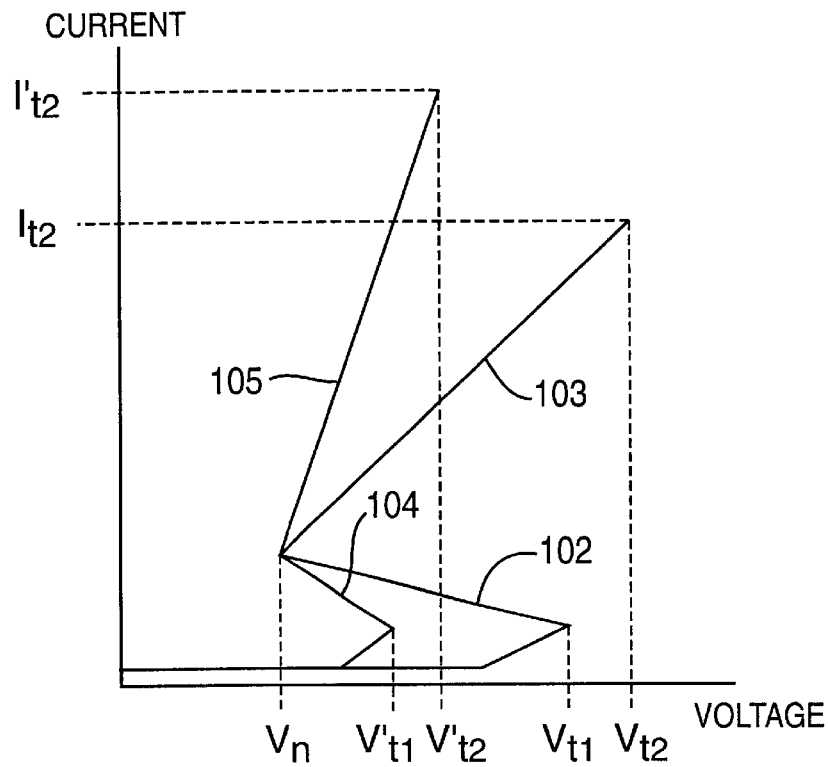
FIGS. 1, 2 and 3 are graphs of the current (I) vs. voltage (V) of ESD devices which are useful for describing the operation of the subject invention.

All techniques of the present invention fulfill the multi-finger uniform performance condition $V'_{t1} < V'_{t2} \leq V_{t2}$ shown in FIG. 1A, without a specific condition required for the relationship of $V_{t1}$ to $V_{t2}$ or $V'_{t2}$ shown in FIG. 1A.

As such, gate/substrate driven turn-on and current balancing embodiments are provided herein to support uniform turn-on of multi-finger semiconductor devices. The multi-finger turn-on layout embodiments allow significantly reduced "on-resistance" as compared to known devices. A source-gate biasing technique is introduced which can be applied to any multi-finger transistor device. Hereafter, the invention addresses multi-finger NMOS transistors.

Figure 5:
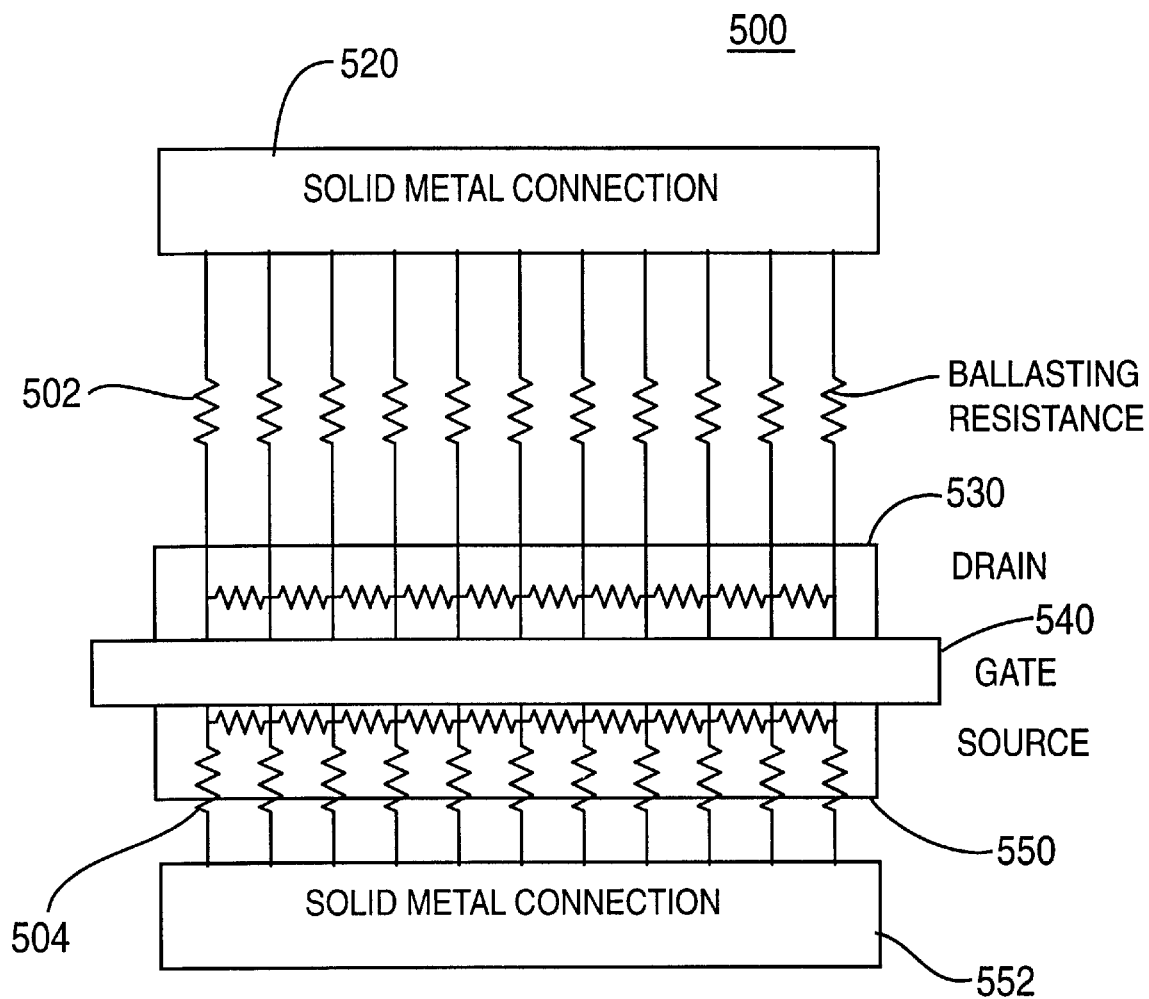
FIG. 5 is top plan view, partly in schematic diagram form, which illustrates a device layout of a fully silicided current ballasting ESD protection circuit.

Referring now to FIG. 5, small slices of resistive material are shown in the layout embodiment 500. In the exemplary embodiment of a single transistor finger, the slices, generally designated 502, may be formed of metal, metal interconnect, polysilicon or silicided polysilicon or their metal interconnects or silicon-metal interconnects. Alternatively they may be formed, from resistive channels in a semiconductor substrate. Ballast resistors 504 may also be formed to connect the source 550 to a connector 552 that may, for example, be connected to a source of reference potential (e.g. ground). Although FIG. 5 shows ballast resistors coupled to both the source and drain of the transistor, it is contemplated that ballasting resistors may be connected only to the source or only to the drain.

Figure 6A:
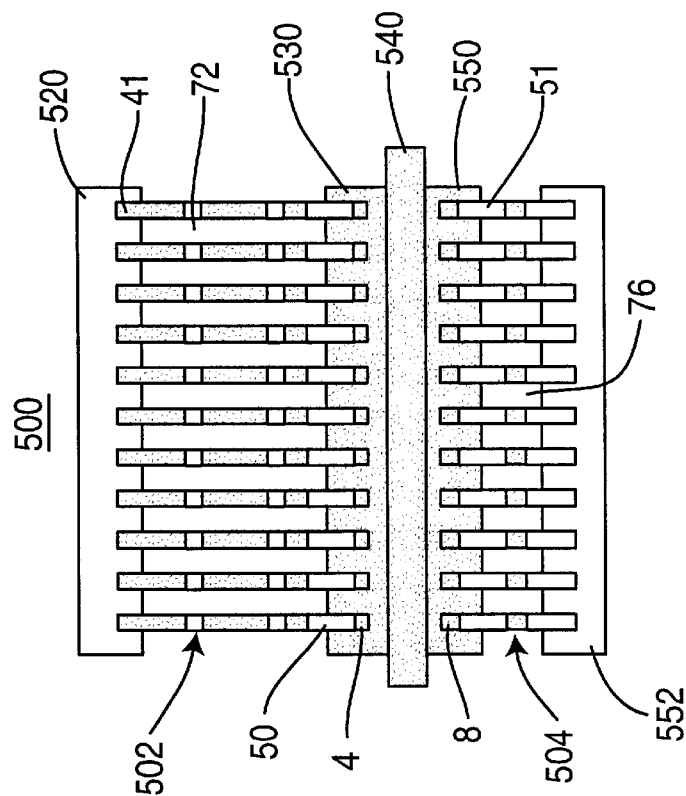
FIG. 6A is a top plan view of a prior art ESD protection circuit which uses vertically meandering vias and connection layers to form parallel ballasting resistors.

FIG. 6A is a top plan view of an exemplary embodiment of a single transistor finger design employing (vertical meandering) strips of metal, polysilicon and interconnects between metals, between metal and silicon and between polysilicon and metal, generally designated VM as shown. In this embodiment, each strip 502 and 504, is formed by joining, for example, polysilicon and metal strips formed at different levels in the integrated circuit process with contact vias that are also a part of the process. The ballasting resistors 502 and 504 are formed by the series connection of polysilicon, vias, contacts and metal. Ballasting resistors 502 and 504 are isolated by the same mechanism that isolates the components of each ballasting resistor. Vertically meandering nonintersecting strips 502, on the drain side of the device, are coupled to the silicided drain region 530 by the connecting terminals 4. The vertically meandering nonintersecting strips 502 are separated by spacings 72. Vertically meandering nonintersecting strips 504, on the source side of the device, are coupled to silicided source region 550 at the connecting terminals 8. The strips 504 are configured to be nonintersecting and are separated by spacings 76.

Figure 6B:
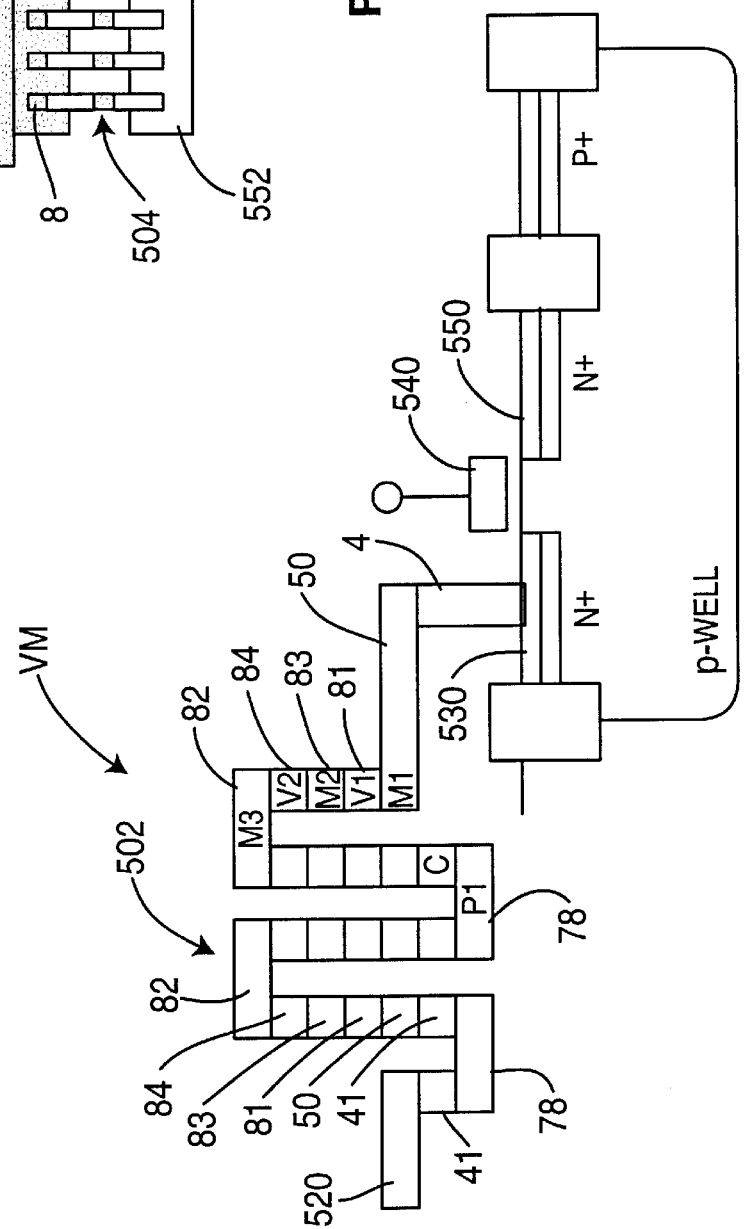
FIG. 6B is a cross sectional view of one of the vertically meandering strips shown in FIG. 6A and a portion of an active device coupled to the strip.

FIG. 6B is a cross sectional view of a single vertically meandering strip 502 according to the exemplary embodiment of a single transistor finger design according to the invention. This meandering strip connects the common terminal 520 to the drain region 530 of the ESD device. Starting at the external connector 520, the strip 502 comprises a connector (or interconnect) 41 down to a segment of polysilicon 78, up to another connector 41, to a metal layer 50, to a via 81, to a segment of a second metal layer 83, to a second via 84 and to a segment of a third metal layer 82. The segment of the third metal layer 82 is connected to another segment of the polysilicon layer 78 through a series connection of a via, a segment of the second metal layer, another via, a segment of the first metal layer and a connector. This second segment of polysilicon is connected to a second segment of the third metal layer 82 through a connector, a segment of the first metal layer, a via, a segment of the second metal layer and another via. Finally, in this exemplary embodiment, the second segment of the third metal layer 82 is connected to the drain region 530 of the ESD device through a series connection of a via 84, a segment of the second metal layer 83, another via 81, a segment of the first metal layer 50 and a connector 4.

In the exemplary embodiment of the invention, the first, second and third metal layers may be aluminum or copper films and the vias and connecting terminals may be tungsten or copper plugs. These series connections form the ballasting resistor 502. In the exemplary embodiment, each of the interconnects adds a significant resistance (e.g. 5 to 10 Ω in advanced deep sub-micron technologies) to the ballasting resistor 502. Each of the other layers also adds resistance, typically the resistance of the metal layers is negligible compared to the combined resistance of the polysilicon layers 78, the connectors 41, and the vias 81 and 84.

The number of layers and the number of meanders is exemplary only. It is contemplated that a satisfactory ballasting resistor may be fabricated using more or fewer layers and/or more or fewer meanders.

The actual resistance value is mainly achieved by the interconnects and polysilicon layers which have a higher resistance (30 to 50 times) than the metal layers. The number of metal layers and vias can be rather high in advanced processes allowing a relatively compact layout.

Figure 6C:
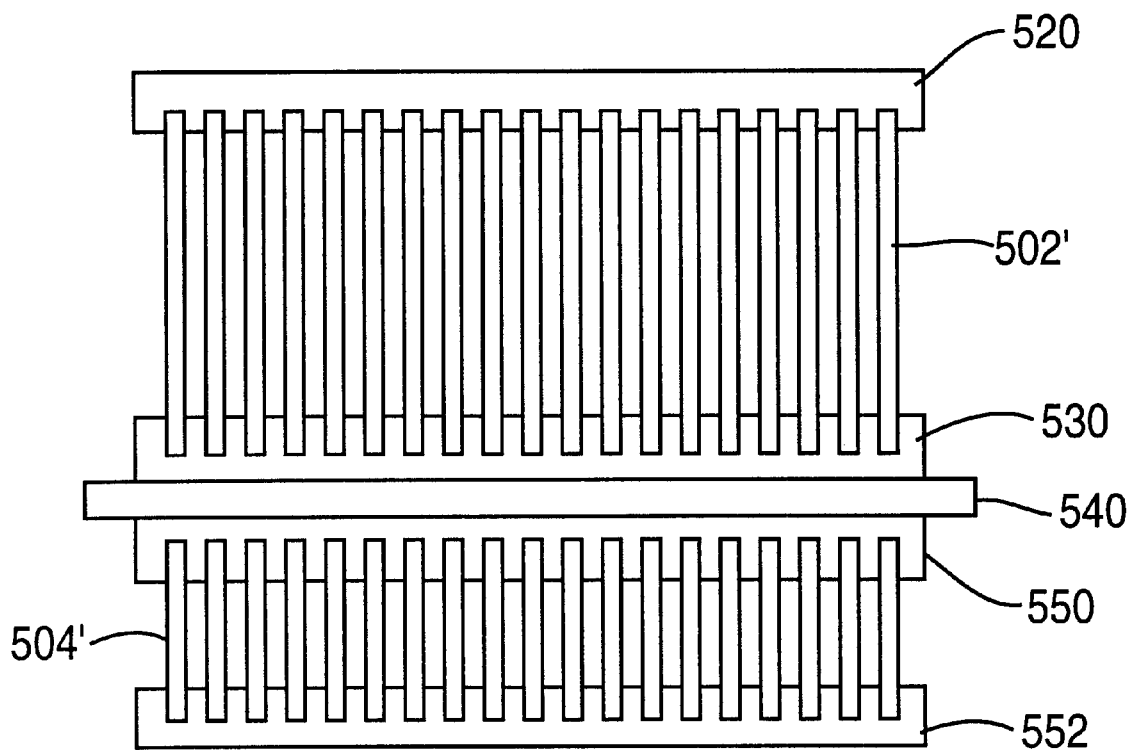
FIG. 6C is a top plan view of a prior art ESD protection circuit which uses parallel silicided polysilicon strips to form parallel ballasting resistors.

FIG. 6C is a top plan view of an exemplary embodiment of a single transistor finger of a multi-fingered ESD device that employs mainly polysilicon strips and interconnects to form the ballast resistors 502' and 504'. In this exemplary embodiment, parallel polysilicon strips 502' are formed on top of an insulating oxide layer (not shown) to connect the first circuit terminal 520 to respective parallel FETs formed between the drain region 530 and source region 550. In the same way, the source ballasting resistors 504' are formed by depositing parallel strips of polysilicon between the respective channels on the source region 550 and the second circuit terminal 552. The parallel strips may be fully coated with silicide. In FIG. 6C, the connection of the gate 540 is not shown. While either of the methods shown in FIGS. 6A and 6C may be used to form single transistor fingers suitable for use with the subject invention, the method shown in FIG. 6C may produce more compact and more IC integration compatible multi-finger devices than the simple transistors produced using the method shown in FIG. 6A. Although the ESD devices shown in FIGS. 5 and 6A through 6C include both drain resistors 502 and source resistors 504, it is contemplated that either of these resistors may be eliminated.

Figure 7:
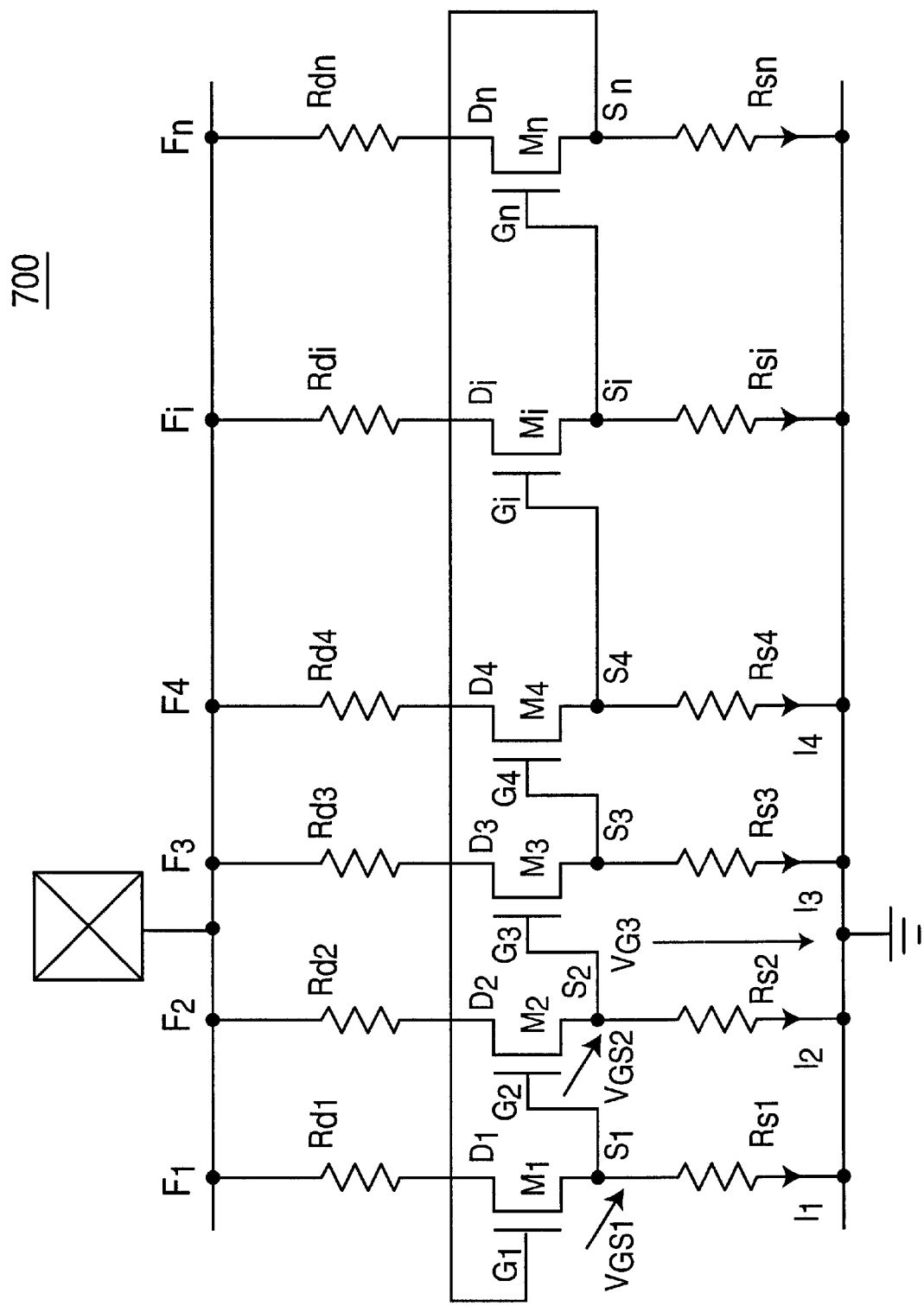
FIG. 7 is a schematic diagram of a multi-finger device in accordance with a first embodiment of the present invention.

FIG. 7 depicts the schematic circuit diagram of a multi-finger NMOS structure 700 in accordance with the present invention. Fingers $F_1$ to $F_n$ are exemplary of the single transistor finger structures used for illustrating the operation of the transistor layouts in accordance with the present invention. The resistive ballasting elements $R_{Si}$, $R_{Di}$ can be formed as described above or by other means as would be known to the skilled person. Resistive ballasting elements $R_{d1}$ to $R_{dn}$ are connected in series with the drains $D_i$ of MOSFET's $M_1$ to $M_n$. Resistive ballasting elements $R_{s1}$ to $R_{sn}$ are connected in series with sources $S_1$ to $S_n$ of MOSFET's $M_1$ to $M_n$ and connected to a source of reference potential (e.g., Vss or ground)

In operation, a homogenizing effect is realized by turning on all the fingers by source-gate biasing during an ESD event with positive ESD biasing between the first and second circuit terminals as described herein. For negative biasing, typically diodes, which do not pose a multifinger performance issue, are turned on. Therefore, the polarity of the ESD biasing is not addressed further. As soon as one finger, e.g. $F_2$, is triggered during an ESD event most of the initial ESD current flows through the source ballasting resistance $R_{S2}$. The resulting voltage drop across $R_{S2}$, (i.e. the positive potential at the internal source node $S_2$) can be assessed. By coupling the node $S_2$ to the gate $G_3$ of the adjacent NMOS finger $F_3$, MOS operation is initiated in this device section ($V_{G3}=V_{S2}$). This biasing of adjacent devices is referred herein as the gate-coupling effect. The gate coupling effect leads to a reduction of the parasitic BJT triggering voltage from $V_{t1}$ to $V'_{t1}$ (as shown in FIG. 1A) within the NMOS finger $F_3$.

Figure 2:
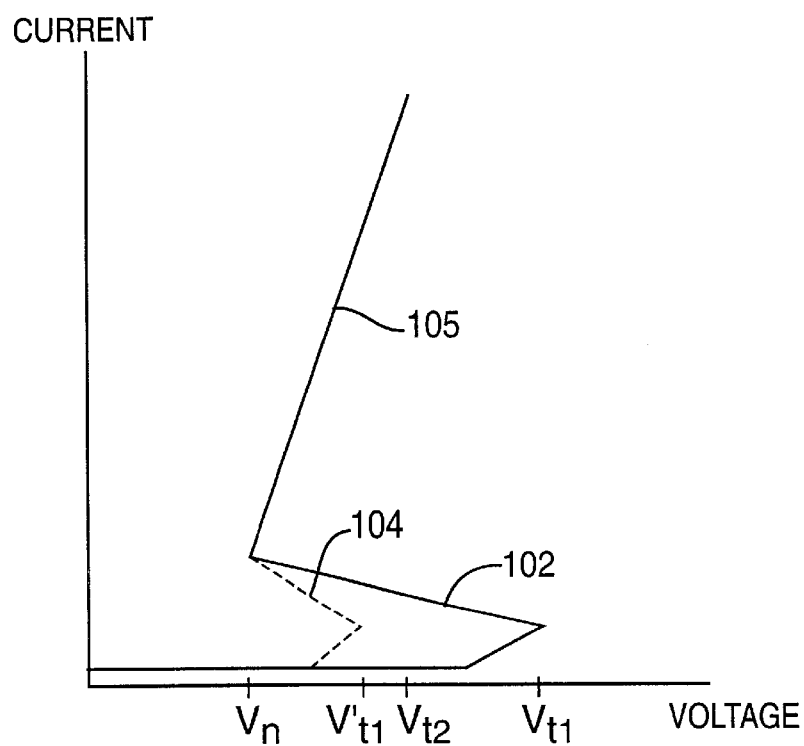
Figure 3:
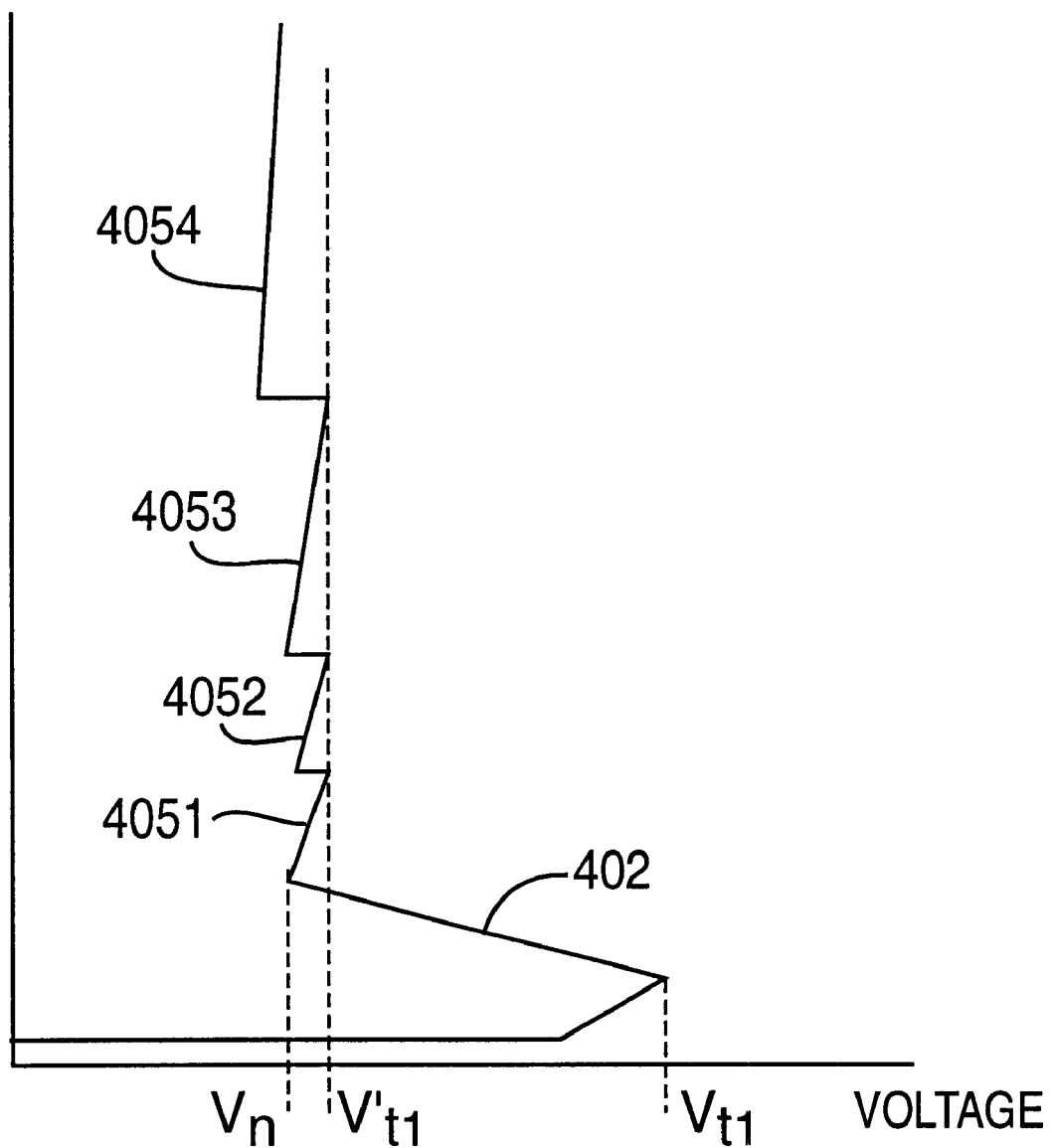
Figure 4A:
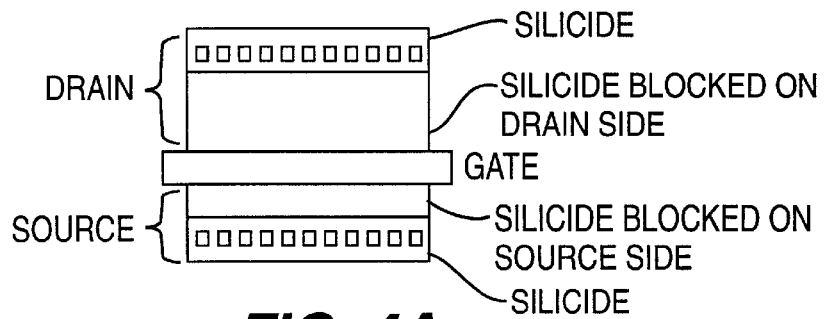
FIG. 4A is a top plan view of a prior art MOS device layout with local blocking of silicide.
Figure 4B:
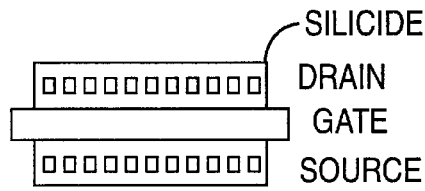
FIG. 4B is a top plan view of a prior art MOS device layout fully silicided and having minimum dimensions.
Figure 4C:
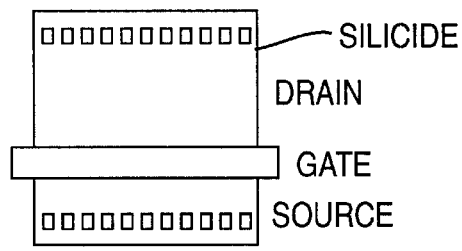
FIG. 4C is a top plan view of a prior art MOS device layout fully silicided and having additional spacings.
Figure 4D:
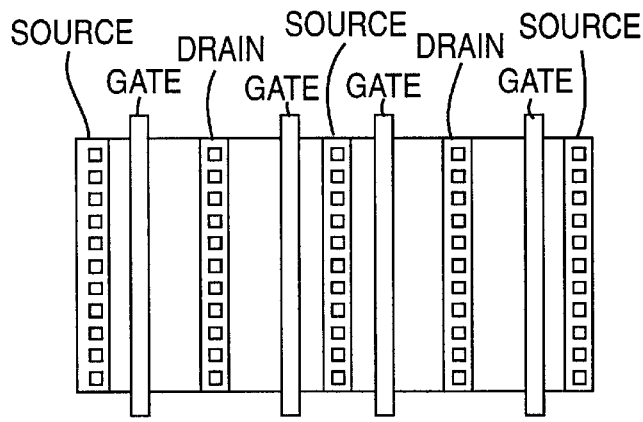
FIG. 4D is a top plan view of a prior art multi-finger MOS device with silicide blocking.

As a result, finger $F_3$ is turned on in BJT snapback operation (see curves 104 and 105 of FIG. 2) before second breakdown is reached in the initially switched on finger $F_2$. It is noted that, in FIG. 2, $V_{t1}'<V_{t2}$ but there is no special requirement for the relative potentials of $V_{t1}$ to $V_{t2}$ or $V'_{t2}$. In other words, the source-gate bias causes multi-fingered turn-on with a modified condition for uniform ESD performance. The unmodified condition was $V_{t1}<V_{t2}$ for all finger transistors. Consequently, the source current through $F_3$ and the voltage drop across $R_{S3}$ lead to the same pull-up of the gate $G_4$ and turn-on of the neighboring finger ($F_4$ in FIG. 7). FIG. 3 shows an exemplary system employing four parasitic BJT devices each of which is activated (i.e. turned-on) by a previous device except for the first one which naturally triggers at $V_{t1}$. The curves 402 and 4051 represent the turn-on of the initial BJT and curves 4052, 4053 and 4054 represent the turn-on of the second through fourth transistors. As shown in FIG. 3, the biasing of the second through fourth BJTs by the first through third BJTs reduces the voltage requirement on the pad from $V_{t1}$ to $V_{t1}'$.

Thus, single device fingers are sequentially switched on until the structure is in a uniform stress current conduction mode. The source of the last finger is connected to the gate of the first finger, completing a loop. The biasing is not transient because the first finger triggers naturally. The source-gate biasing method described herein provides a further current distribution mechanism. In case of a predominant current flow through a certain device section (one finger), this concept effectively re-distributes the current by controlling the gates of adjacent fingers until a uniform distribution is achieved. After the device is in a uniform ESD current conduction state, i.e. all fingers are turned-on and carry essentially the same amount of current, the gate source voltages $V_{GS}$ tend to zero because $I_1=I_2=\ldots I_n$ and $V_{Six}=V_{Gx}$. As a consequence, hazardously high local current densities are avoided.

Note that in the exemplary embodiment all resistors are desirably adjusted such that $R_{S1}=R_{S2}=\ldots=R_{Sn}$ accurately in order to lift the gate source voltage $V_{GS}$ of adjacent fingers above the specific MOS threshold voltage $V_{th}$. It is noted, however, that the gate coupling effect reduces the turn-on voltage $V'_{t1}$ for gate biases less than $V_{th}$. Tuning of the resistor values can be done, for example, by choosing appropriate layout dimensions for the source ballast. For example, a sufficiently large number of vertical meanders or a sufficient polysilicon resistance length for the ballast slices, respectively, increases $R_{Sx}$ enough to fulfill the condition $R_{Sx} \cdot I_{t2,finger} > V_{th}$. In the exemplary embodiment, however, a tolerance margin of $R_{Sx} \cdot I_{t2,finger} > \alpha \cdot V_{th}$ ($\alpha>1$) may be used to ensure turn-on of the next neighboring fingers at a current level less than the $I_{t2}$ current in the incidentally triggered finger.

Figure 8A:
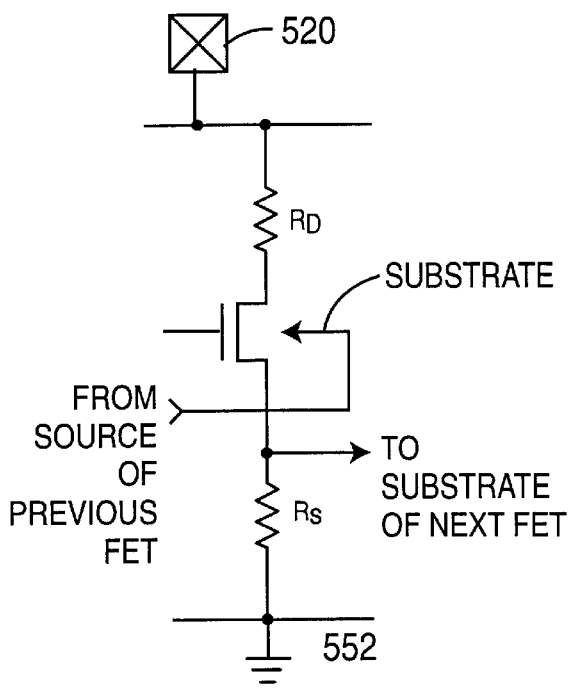
FIG. 8A is a schematic diagram of a second embodiment of the present invention which uses a source-substrate biasing arrangement.
Figure 8B:
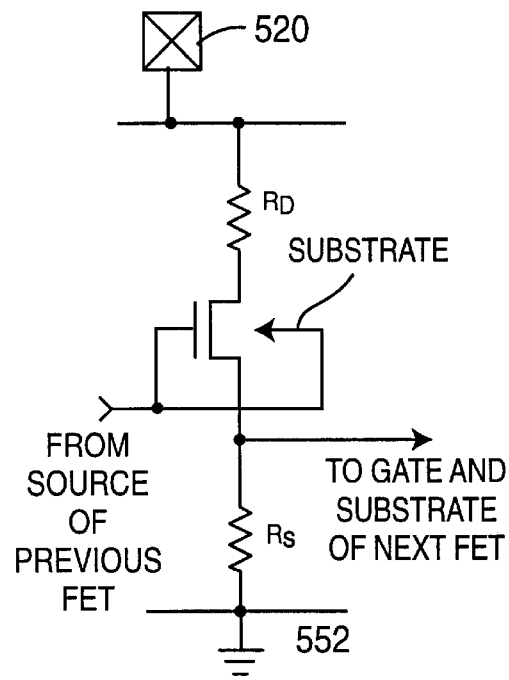
FIG. 8B is a schematic diagram of a third embodiment of the present invention which uses a combined source-gate-substrate biasing arrangement.
Figure 8C:
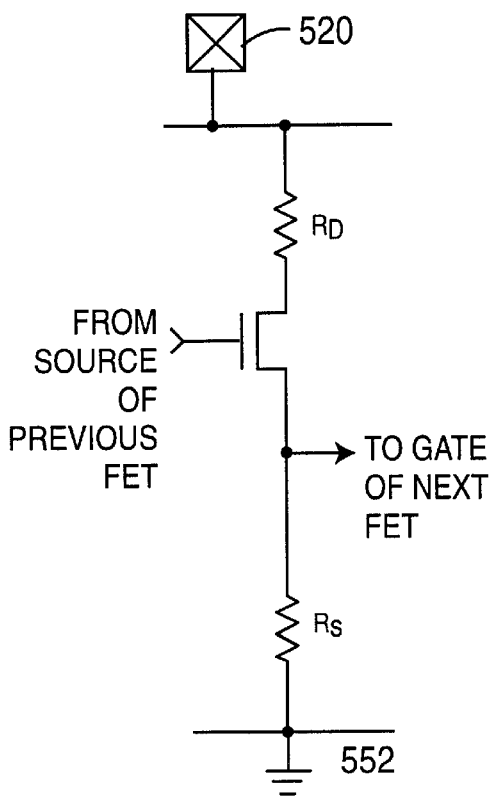
FIG. 8C is a schematic diagram of a fourth embodiment of the present invention which uses a source-gate biasing arrangement.

As an alternative to the gate biasing, a substrate biasing or a combination of both gate biasing and substrate biasing can be used as shown in FIG. 8A–8D. FIG. 8A is a schematic diagram of a multi-finger device using a substrate biasing arrangement, FIG. 8B is a schematic diagram of a multi-finger device using a combined substrate-gate biasing arrangement, FIG. 8C is a schematic diagram of a gate biasing arrangement, the arrangement shown in FIG. 8D employs split source resistors for a gate-biasing, substrate biasing or combined substrate-gate biasing arrangement.

Figure 8D:
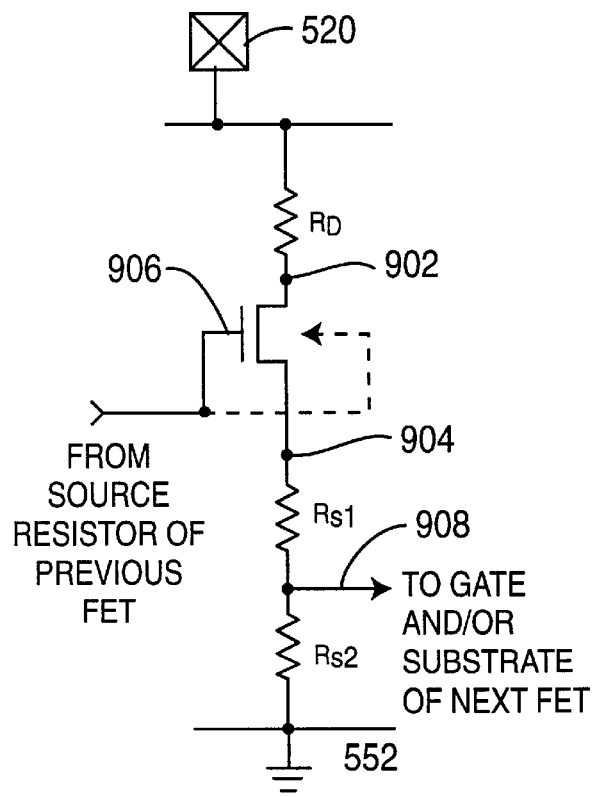
FIG. 8D is a schematic diagram of a fifth embodiment of the present invention which uses a source-gate biasing arrangement and a segmented source resistance.

As shown in FIG. 8A, the transistors in the multi-finger ESD circuit are configured such that the substrate (base of the parasitic BJT) of the one transistor is coupled to the source electrode of the previous transistor. In one exemplary embodiment of the invention, the substrate of the first transistor in the multi-finger ESD structure is coupled to the source electrode of the last transistor in the structure. FIG. 8B shows an alternative configuration in which the gate and substrate of each transistor in the MFT structure are connected together and coupled to the source electrode of the previous transistor. FIG. 8C shows another alternative embodiment in which the gate of each transistor in the MFT structure is connected to the source electrode of the previous transistor in the structure. FIG. 8D shows a modification which may be used with any of the configurations shown in FIGS. 8A, 8B and 8C. Instead of connecting directly to the source of the preceding transistor, the circuit shown in FIG. 8D connects to the source resistor, effectively splitting the source resistance into two components. The configuration shown in FIG. 8D in which the gate electrode of one transistor is coupled to the source resistance of the previous transistor is described below with reference to FIG. 9. FIG. 8D represents the preferred embodiment of the source bias coupling. The combined gate-substrate configuration of FIG. 8B is described below with reference to FIG. 10.

Figure 9:
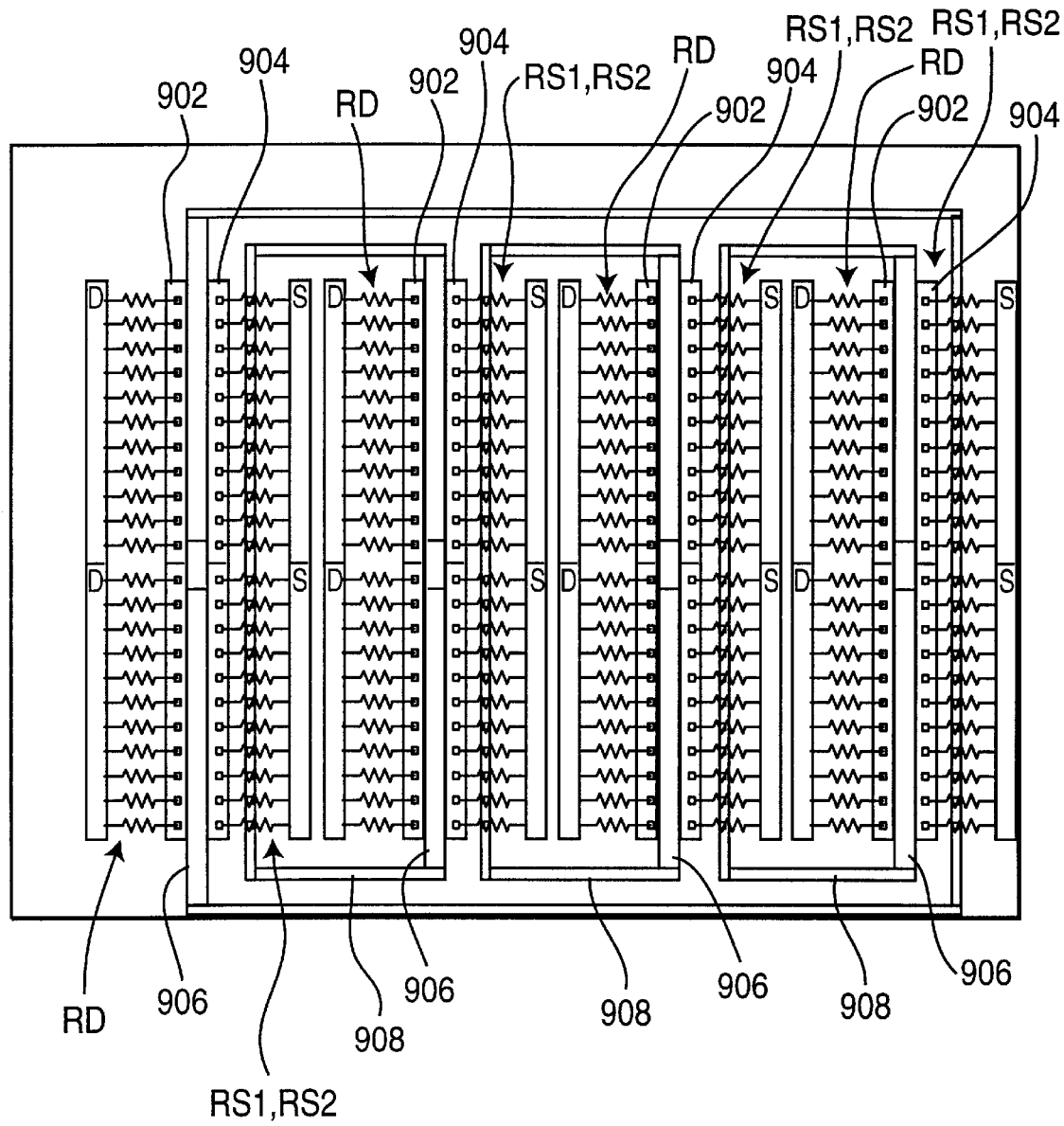
FIG. 9 is a device layout of a multi-finger NMOS device using the source-gate biasing arrangement of FIG. 8D.
Figure 10:
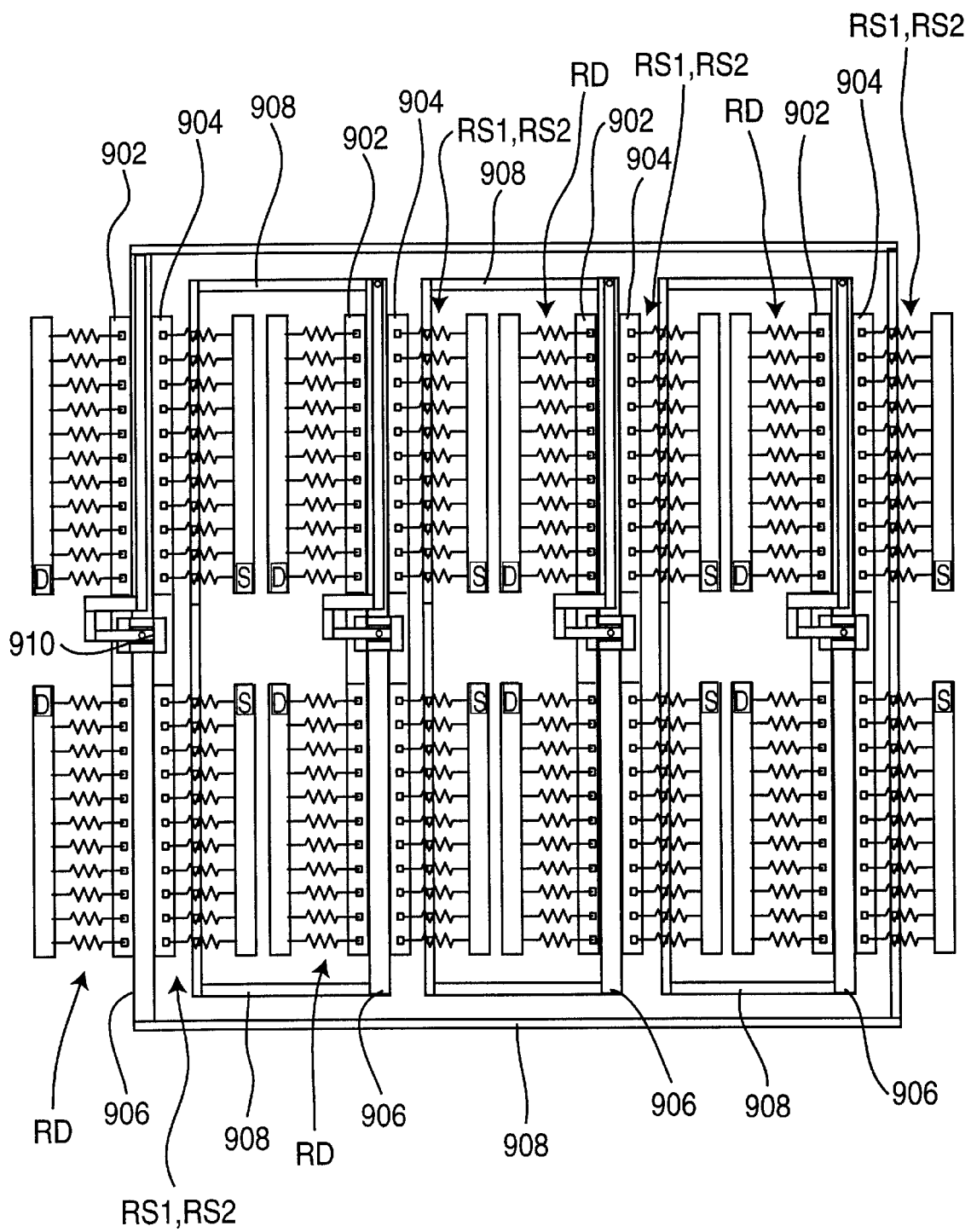
FIG. 10 is a device layout of a multi-finger NMOS device using the source-gate-substrate biasing arrangement of FIG. 8B.

FIG. 9 and FIG. 10 are top-plan views, partly in schematic diagram form that show exemplary layouts for the gate and the substrate (i.e. base) biasing techniques of a multi-finger NMOS device in accordance with the present invention. In both of these exemplary layouts, strips, VM, are used as drain resistance to provide a desired level of ballasting and as source resistance to pull up the adjacent gates (and substrate regions, respectively). As shown in FIG. 9, the strips are shown connecting the drain terminals D to the drain regions 902 of the NMOS devices. Further strips connect the source terminals S to the respective source regions 904 of the NMOS devices. Connectors 906 and 908 electrically couple the gate electrodes of one single finger to the source resistance of the preceding single finger. As shown in FIG. 9, the gate electrode of the first ESD device is connected to the source resistance of the last ESD device.

FIG. 10 shows a similar arrangement, however the channel regions of the NMOS devices are connected to the gate electrodes of the NMOS devices via the substrate connector 910. In the exemplary embodiment of the invention, the substrate connector 910 is formed by a P+ connector that is separated from the drain and source regions of the NMOS device by a ring of polysilicon. It is understood that any other P+ connector 910 to the substrate is suitable but may consume more area.

The gate and the substrate biasing mechanisms counteract current inhomogenities possible in any real device. Drain ballast resistance can be reduced or may even become redundant. This leads to a compact device design with regard to ESD protection and, to a low on-resistance for the protection device. In addition, more efficient voltage clamping capabilities and a reduced power dissipation within the active device are achieved.

The above-described circuitry may be applied as an output driver if the substrate-only biasing arrangements are selected.

A. Simultaneous Gate Biasing

Figure 11:
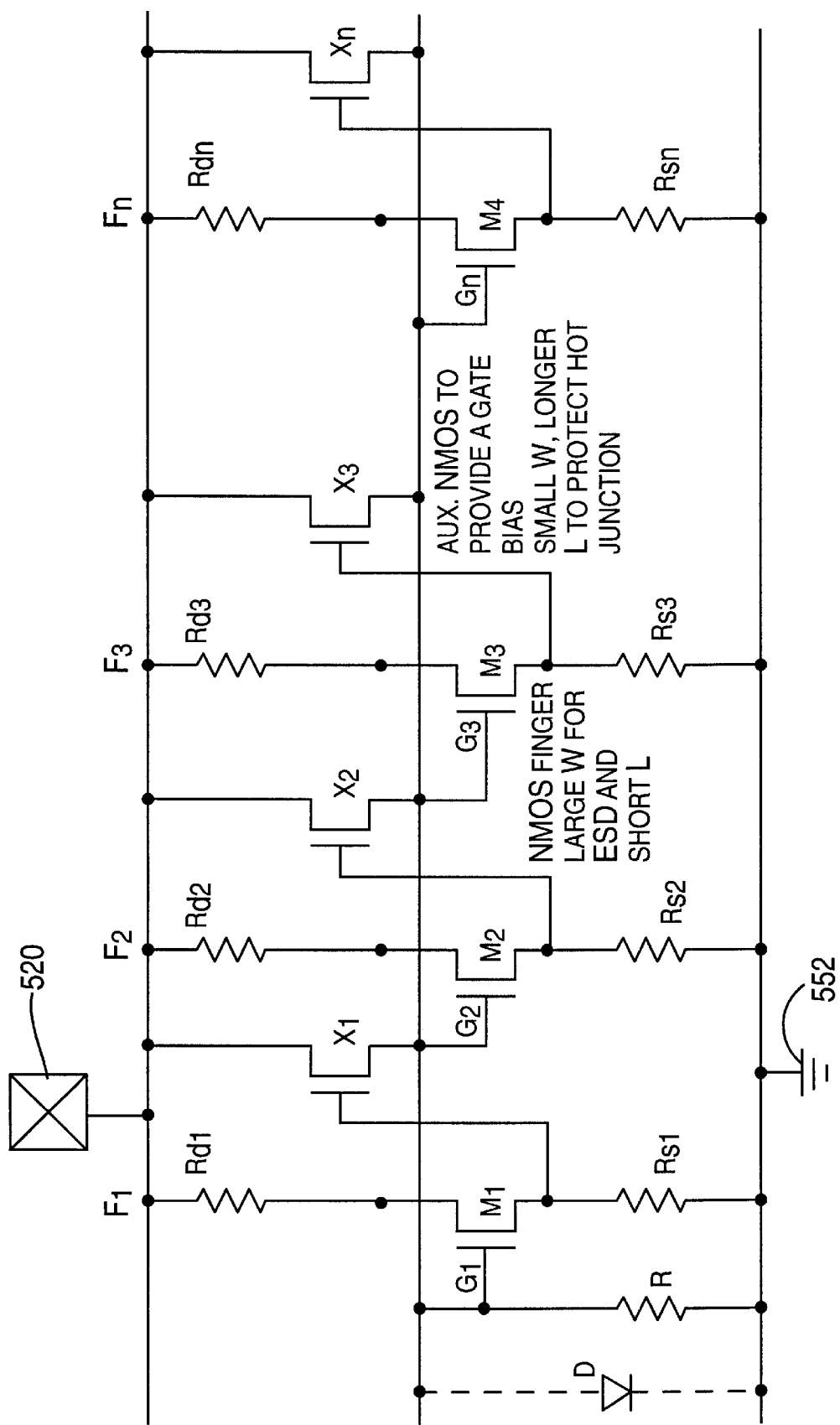
FIG. 11 is a schematic diagram of a sixth embodiment of the present invention having simultaneous gate biasing.

Another possible way of implementing a gate biasing technique is described below with reference to FIG. 11. In order to further reduce the turn-on time of the full multi-finger device to a minimum value, the gates of all fingers may be biased and turned-on simultaneously as long as the first triggered finger is still operating below its failure current $I_{t2}$. The active approach depicted in FIG. 11 employs small supplementary NMOS transistors, generally designated $X_1$ to $X_n$ to control the connected gates of the ESD protection device fingers. If, for example, finger $F_2$ is turned on, the voltage drop across $R_{S2}$ provides gate coupling to the small gate controlling NMOS device $X_2$, which is eventually turned on. As a result, all of the connected gates are pulled upward through $X_2$. Hence, gate coupling is provided to all NMOS transistors $M_i$ which will be turned-on. In the exemplary embodiment, the resistance R=10 kΩ grounding the gates ensures that the protection device remains inactive during normal circuit operation. Those skilled in the art recognize that the resistance value is dependent upon circuit parameters and is not limited to the 10K value described above. Further, optional diode D may be placed in parallel with the resistor R to limit the bias voltage applied to the gate electrodes of the transistors $M_1$ through $M_N$ to about 0.7V and thus force bipolar mode conduction to dominate over MOS conduction.

Note that it may not be desirable to implement n auxiliary small NMOS transistors for an n-fingered ESD device. Fewer than n transistors with proper gate connection may be able to bias all 'off-fingers' into a conductive state.

B. Active PMOS and NMOS Biasing

Figure 12:
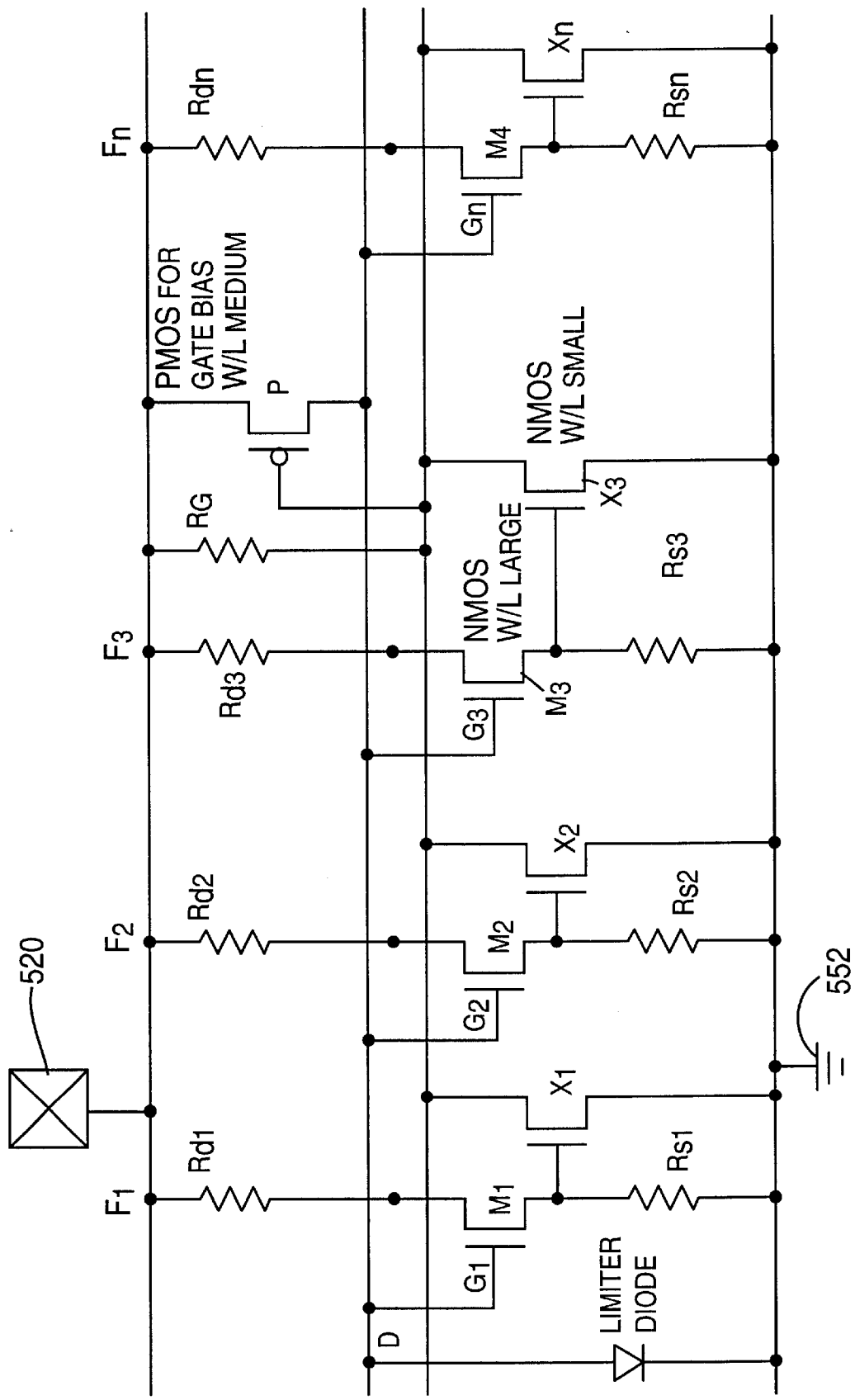
FIG. 12 is a schematic diagram of a seventh embodiment of the invention having simultaneous gate biasing.

A further exemplary embodiment, shown in FIG. 12, an alternative gate driven turn-on and current balancing arrangement is utilized to provide uniform ESD performance of multi-finger structures. This particular biasing technique is based on active NMOS and PMOS circuitry and provides a safer and more efficient bias signal to turn on multiple fingers. The PMOS device supplies the gate bias for the entire structure and does not need to be present multiple times as in an NMOS-only approach.

In this embodiment, one relatively large PMOS transistor P can provide more drive current. The large PMOS functions as if much smaller traded-off NMOS's—one for each finger separately—provide the gate bias. Any gate delays are further offset by the larger drive current capability of the PMOS.

The hot junction of the PMOS connected to the bond pad and the PMOS-inherent parasitic bipolar PNP transistor are less prone to ESD failure than the small NMOS-drain junctions. Thus the use of the PMOS transistor makes this method of applying a bias voltage less vulnerable to ESD damage.

FIG. 12 depicts the alternative schematic of a multi-finger NMOS structure (fingers $F_1$ to $F_n$) in accordance with an exemplary embodiment.

The active approach depicted in FIG. 12 employs small NMOS transistors $X_1$ to $X_n$ which control the gate electrode of the connected PMOS device, whereas the latter is connected to the pad 520. The PMOS device provides a drive current to charge-up the common gate line and turn-on all of the transistors $M_1$–$M_N$. In contrast to other embodiments of this invention, the PMOS transistor is needed only once for the entire multifinger structure and not in each device finger separately. Thus a larger PMOS device can be easily implemented without unduly sacrificing area of the semiconductor substrate.

To describe the function of the ESD device it is assumed that during an ESD event one arbitrary device finger triggers first. If for example, finger $F_2$ is turned on, the voltage drop across $R_{S2}$ biases the gate of the very small NMOS device $X_2$ causing $X_2$ to turn on. As a result, the gate of the connected PMOS device P is pulled low and the PMOS transistor conducts. This biases all of the connected gates of the multifinger device by simultaneously applying the pad voltage (minus the PMOS on-state voltage drop) to the gates. The triggering voltage $V_{t1}$ of the MOS parasitic BJTs is reduced to a turn-on voltage $V'_{t1}$ below $V_{t2}$ and eventually all fingers are turned on. The high-ohmic resistance of e.g. RG=10 kΩ pulling the PMOS gate high ensures that the protection device remains inactive during normal circuit operation, i.e. when the small NMOS devices $X_n$ are turned off and no current is flowing in the sources of the large multifinger device. An optional diode D may be placed in series with the resistor RG to limit the gate bias to about 0.7V and thus forcing bipolar mode conduction to dominate over MOS conduction.

Furthermore, the above described circuitry can be applied as an output driver transistor because a gate bias from pre-driver stages can be provided without compromising the ESD functionality or regular circuit operation.

C. Diode Source Gate Coupling

Figure 13:
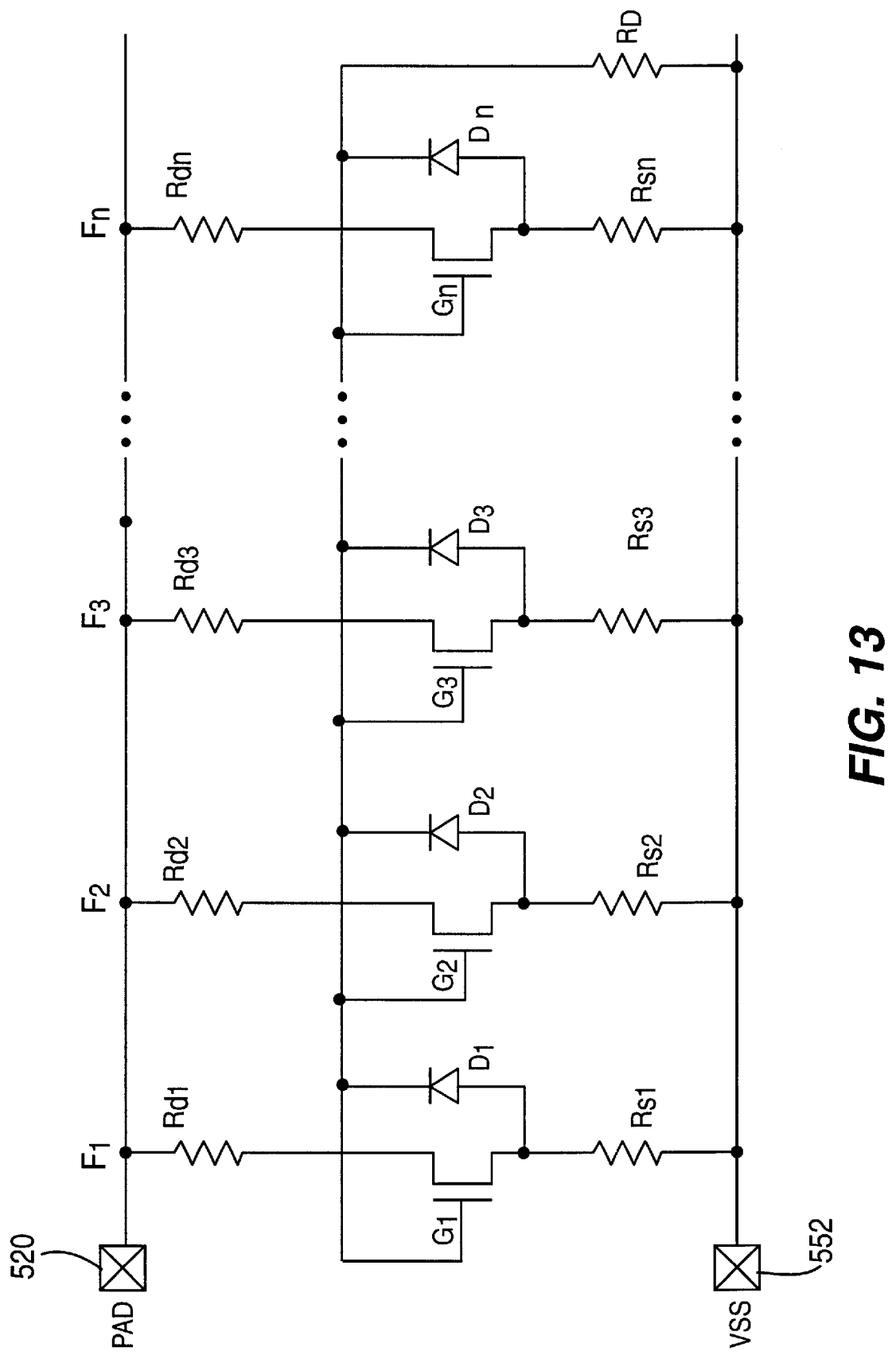
FIG. 13 is a schematic diagram of an eighth embodiment of the invention including a diode gate control network.

A further exemplary embodiment, shown in FIG. 13, provides a gate driven turn-on and current balancing arrangement that results in uniform ESD performance of multi-finger structures. This particular biasing technique is based on a straight-forward diode source-gate coupling configuration which generates a safe and efficient bias signal to turn-on multiple fingers.

Because small or minimum sized diodes can be employed to couple the internal sources to the common gate electrode, the additional area consumed by the diode is minimal. Compact, area efficient structures can be built. Additionally, this simultaneous gate biasing technique can be applied without any compromises for output driver stages.

FIG. 13 depicts the schematic of a multi-finger NMOS structure (fingers $F_1$ to $F_n$) indicating the special arrangement used for the technique. The approach depicted in FIG. 13 employs small diodes $D_1 \ldots D_n$ which are connected between the internal source nodes and a common gate line, respectively.

For the function of the device it is assumed that, during an ESD event, one arbitrary device finger triggers first. If e.g. finger $F_2$ is turned on initially, a voltage drop across resistor $R_{S2}$ occurs. Eventually, the corresponding diode $D_2$ becomes forward biased. The other diodes are reverse biased preventing a large loss of the charge on the connected gate line to ground. As a result, the current flow through the diode to the gate electrodes charges the connected gate electrodes $G_1$–$G_N$ of all MOS fingers. Hence, all of the connected gates of the multifinger device are simultaneously biased providing a positive gate-source bias (sub-threshold or above MOS threshold voltage $V_{th}$).

As a consequence, the triggering voltage $V_{t1}$ of the still inactive parasitic MOS-BJTs is reduced to the turn-on voltage $V'_{t1}$. This eventually turns on all fingers. The relatively high-ohmic resistance of (e.g. RG=10 kΩ) pulls the common gate line to ground and ensures an inactive protection device during normal circuit operation. This is the case when only normal operational MOS currents are flowing in the sources of the large multifinger device and the diodes are not forward biased.

Furthermore, the exemplary circuitry has the advantage that it can be applied in NMOS output drivers because a gate bias from pre-driver stages can be provided to the connected gate electrodes and compromises neither the ESD functionality nor regular circuit operation. Furthermore, a relatively small current through the source resistances $R_{S1}$–$R_{SN}$ under normal operating conditions does not provide a sufficient forward bias to the corresponding diodes to have a significant impact on the bias voltage applied to the connected gate electrodes $G_1$–$G_n$.

In an alternative embodiment, Schottky diodes may be used instead of regular pn diodes, as Schottky diodes become forward biased at a lower potential.

D. Single Trigger Multi-Finger

Figure 14:
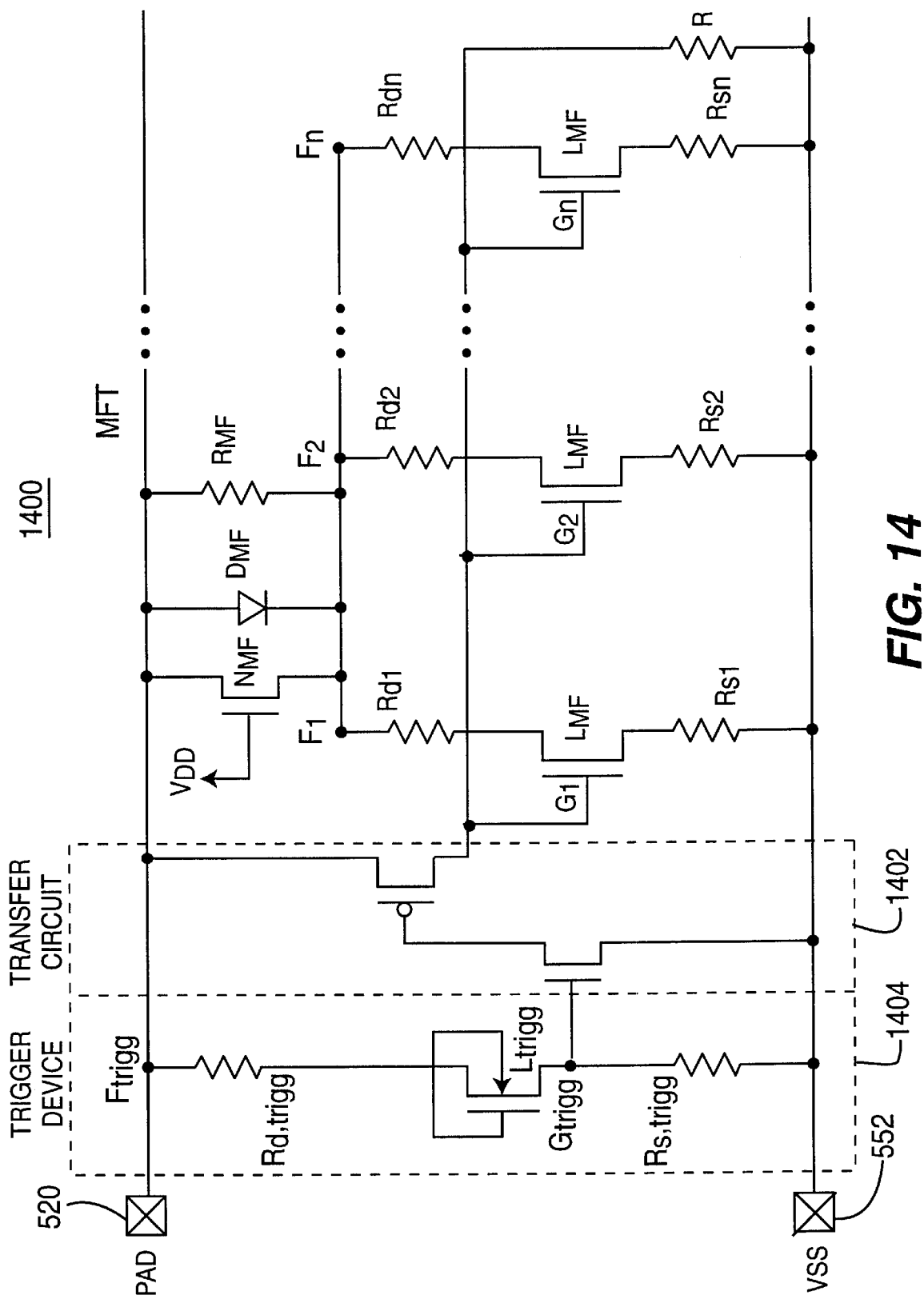
FIG. 14 is a schematic diagram of an ninth embodiment of the invention including multi-finger turn-on transistors (MFT), a trigger circuit and a transfer circuit.

A further exemplary embodiment, as shown in FIG. 14, is based on an initial turn-on of the so-called 'trigger-finger' during ESD stress conditions. A source-gate coupling configuration connecting the source of the trigger-finger and the gates of the multi-finger turn-on transistors (MFTs) includes a signal transfer circuit and provides a safe and efficient bias signal which is desirable for the turn-on of multiple fingers.

FIG. 14 is a schematic diagram of a multi-finger NMOS structure (fingers $F_1$ to $F_n$) in accordance with the exemplary embodiment. The circuit includes the trigger-finger circuit 1404, the transfer circuit 1402, and the MFT fingers include the diode DMF to increase the triggering voltage $V_{t1}$ of the otherwise first trigging finger, as well as the resistor $R_{MF}$ and transistor $N_{MF}$ as described below to reduce the switching delay of the NMOS structure under normal operation conditions imposed by the diode $D_{MF}$. Possible implementations of the resistive ballasting elements denoted drain resistance $R_d$, $R_{d,trigg}$ and source resistance $R_s$, $R_{s,trigg}$ and other methods of multifinger turn-on are described herein.

In the embodiment shown in FIG. 14, the trigger-finger turns on first to operate in snapback before the other structures are triggered. A sufficient voltage drop across the triggering source resistance $R_{S,trigg}$ is provided to turn on the MFT 1400 by coupling the source potential simultaneously to all MFT gates $G_1$–$G_n$. This enables MOS current to flow which results in a triggering voltage reduction towards the holding voltage, avoiding a dangerous non-uniform triggering of a single finger. The source signal given by the trigger-finger or "trigger device" 1404 is transferred to the MFT 1400 by a 'transfer-circuit' 1402.

The transfer circuit 1402 translates the source potential occurring at the internal source node of the triggering device to a simultaneous positive gate bias of all MFT fingers $G_1$–$G_n$.

As soon as all fingers are turned on and the current is distributed homogeneously among the device segments, the MFT gate-source bias is less than the specific threshold voltage of the NMOS structures, which prevents large surface currents and thus hot carrier injection into the gates $G_1$ to $G_n$. Under normal operation conditions, the delay imposed by the diode $D_{MF}$ in series with NMOS fingers is sufficiently compensated. To counteract losses in triggering speed, an additional NMOS $N_{MF}$ pull-down can be inserted in parallel with the diode $D_{MF}$. The gate electrode of this device is desirably connected to the supply $V_{DD}$. The resistance $R_{MF}$ is introduced to reach 'logic zero' at the output pad 520. Those skilled in the art recognize that the resistance value depends on circuit parameters and is not limited to any particular value described above.

In order to meet all of the objectives, the circuit shown in FIG. 14 implements precautions such as those described in the following sections:

The trigger-finger is turned on first, i.e. $V_{t1,trigg} < V_{t1,MFT}$.

The following measures can be taken to increase the triggering voltage of the MFT fingers $V_{t1,MFT}$: diode $D_{MF}$ which is connected in series with MFT fingers increases triggering voltage of MFT NMOS fingers by one diode voltage. In the semiconductor layout, a larger gate length (+10–20%) for the MFT fingers $L_{MFT}$ can be chosen compared to the trigger-finger $L_{trigg}$ which should be at the design rule minimum. A local substrate tie for each MOS finger is implemented in the exemplary embodiment. Also, the introduction of transistor $N_{MF}$, which is used for other reasons, as described below, significantly increases the trigger voltage of the fingers $F_1, \ldots F_N$, which are effectively connected in series with $N_{MF}$, if the diode $D_{MF}$ is not present and $R_{MF}$ is either not present or significantly large (e.g. in the kΩ range).

The following measures can be taken to reduce the triggering voltage of the trigger-finger $V_{t1,trigg}$: connect the gate electrode to the bulk of the trigger-finger to support the turn-on of the structure by biasing the gate (gate-coupling effect). The gate length of the trigger-finger $L_{trigg}$ should be at the design rule minimum, in the exemplary embodiment, a global substrate tie, e.g. 10 μm apart from the source edge, is implemented.

The source resistance of the trigger-finger $R_{S,trigg}$ of trigger device 1404 desirably provides a voltage drop on the order of the NMOS threshold voltage $V_{th}$ (applied to the MFT gate) before second breakdown of the triggering-finger occurs at the maximum current $I_{t2,1f}$ through a single finger. For a safety margin α (e.g. 75%) with regard to the maximum current allowed through the finger (i.e. $\alpha \cdot I_{t2,1f}$), the relation for the trigger source resistance is defined by equation (1)

$$R_{S,trigg} = \frac{V_{th}}{\alpha \cdot I_{t2,1f}} \quad (1)$$

For example, an ESD performance target value of $I_{t2,1f}$=10 mA/um for a NMOS structure, in conjunction with a single finger width of 50 um and a threshold voltage of approximately $V_{th}$=0.5V results in $R_{S,trigg}$=1.33 Ω to be coupled between the source of the triggering element (for α=75%) and the pad 520.

The transfer circuit 1402 translates the source potential occurring at the internal source node of the triggering device to a simultaneous positive gate bias of all MFT fingers. A direct gate connection is not desirable as this would compromise the application of the structure within a self-protecting output driver.

In alternative embodiments, other transfer circuit schemes could make use of a direct diode (e.g. Schottky) connection (not shown) between the triggering source and the common gate line.

As soon as current flows uniformly within all device fingers, MOS operation should be turned off, i.e. $V_{GS} < V_{th}$ while current continues to flow in the devices operating in the bipolar mode. This can be achieved by keeping the internal source voltage of the triggering element of trigger device 1404 below the NMOS threshold voltage. As a consequence, in uniform conduction the current through the trigger-finger is desirably limited to a value less than $\alpha \cdot I_{t2,1f}$ which corresponds, by definition, to the current where $V_{th}$ is reached.

The resistance $R_{MF}$ in parallel with the MFT series diode $D_{MF}$ is used to achieve the 'digital zero' if the NMOS MFT is used in a self-protecting output driver stage. Furthermore, a NMOS pull-down element $N_{MF}$ can be inserted to bridge the diode and to act as an inverter gate pull-up thus enhancing the switching speed. By employing a Schottky diode with a lower forward bias voltage drop (typically about 0.3V) this switching time can be further reduced.

The relatively high ohmic resistance RG (e.g. 10 kΩ) between the connected gate electrodes and $V_{SS}$ prevents the gate electrodes from charging up due to leakage currents during normal operation conditions. Those skilled in the art recognize that the resistance value depends on circuit parameters and is not limited to the 10 KΩ value described above.

Figure 15:
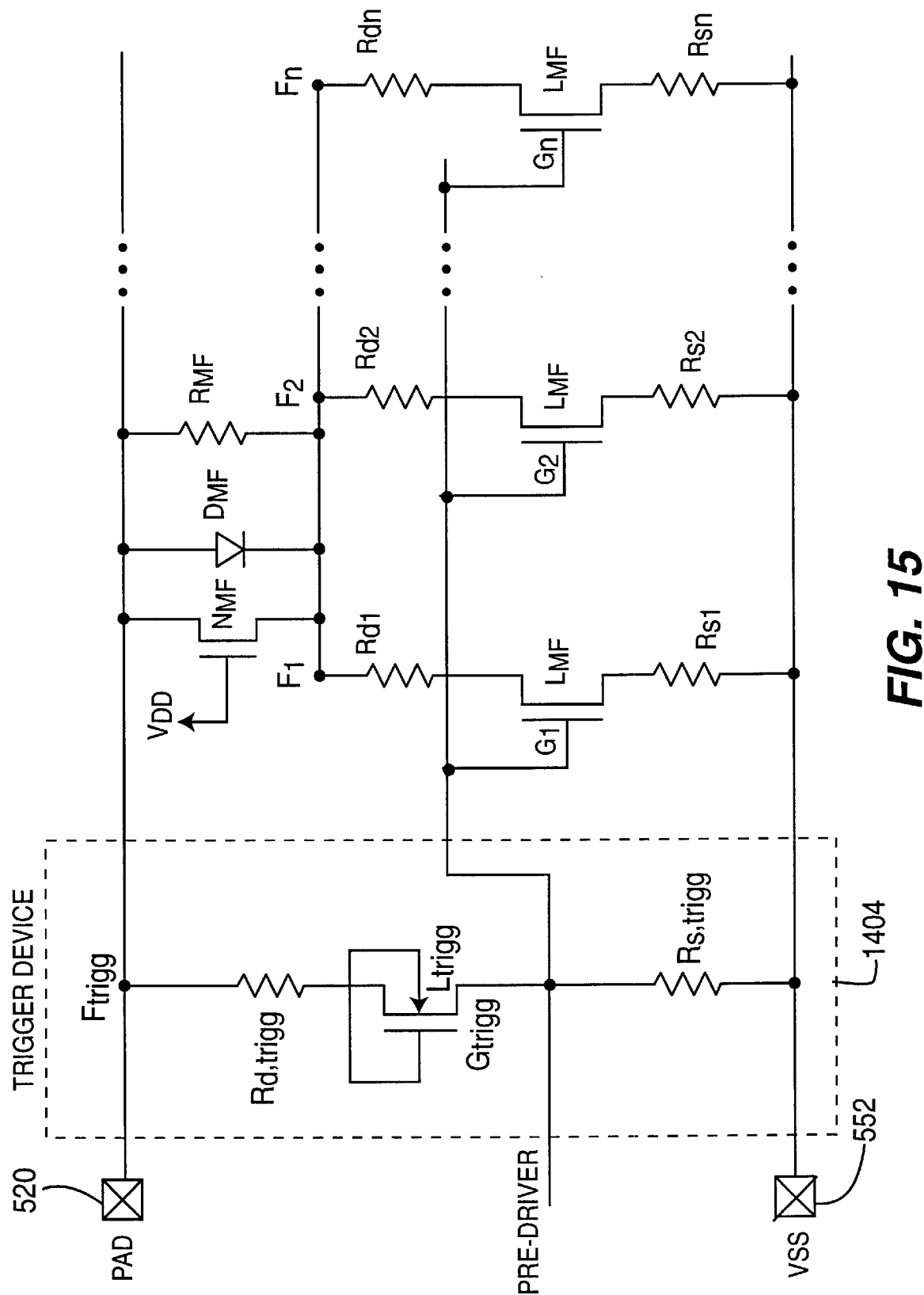
FIG. 15 is a schematic diagram of a tenth embodiment of the invention including a trigger circuit and a MFT circuit.

In an alternative embodiment, shown in FIG. 15 the avalanche breakdown current of the triggering element 1404 is used to turn on the MFT 1400. This embodiment does not use a transfer circuit because a relatively large source resistance $R_{S,trigg}$ (e.g. 10 kΩ) is used to simultaneously and directly bias all of the interconnected gate electrodes using relatively low (avalanche) currents.

This configuration can be used within an output driver as well.

F. Drain-Bulk-Gate Triggering

Figure 16:
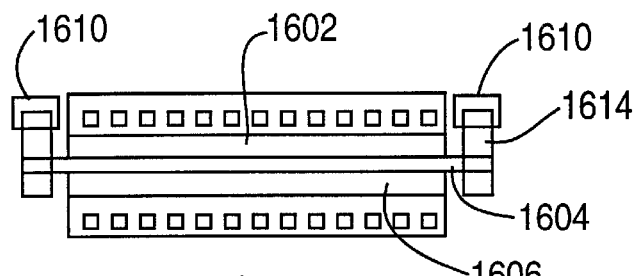
FIG. 16 is top plan view which shows a device layout of a MFT device which uses a gate-substrate coupling technique.
Figure 17A:
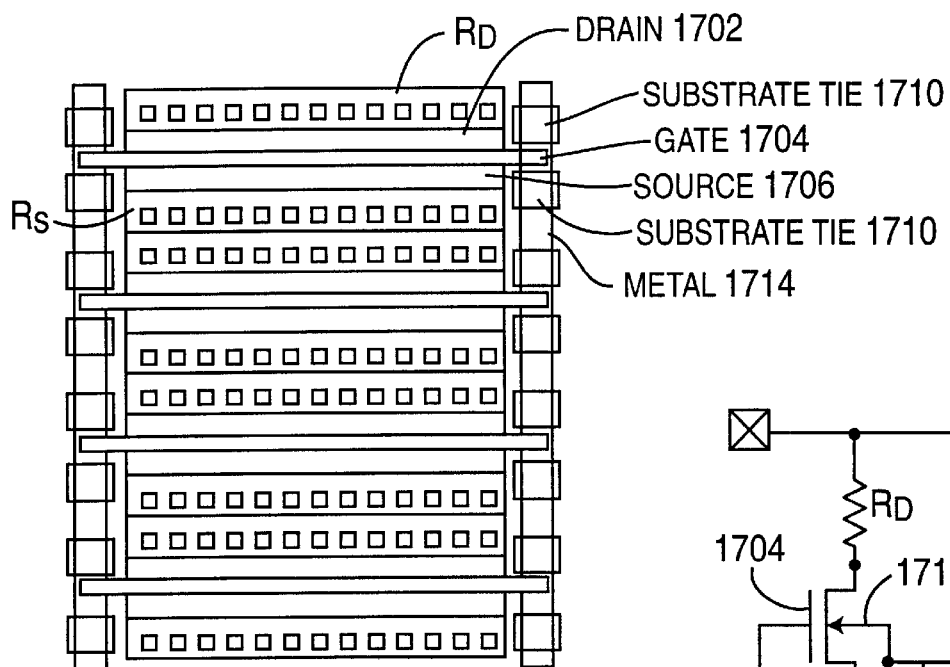
FIG. 17A is a top plan view which shows a device layout of a plurality of parallel connected devices which use a gate-substrate coupling technique.
Figure 17B:
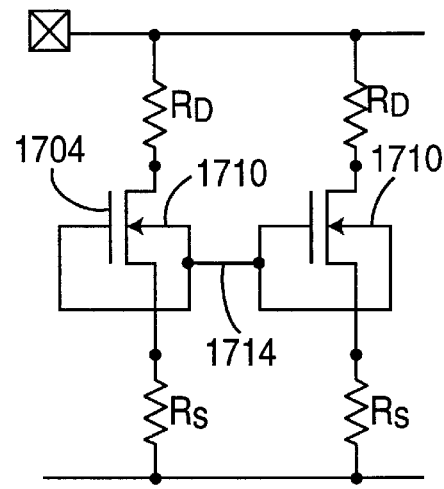
FIG. 17B is a schematic diagram which is useful for describing the structure shown in FIG. 17A.

This particular embodiment, shown in FIGS. 16–17, is based on a semiconductor substrate potential pick-up tying the gates 1604 and 1704 to the substrate (or bulk) rather than wiring it hard to ground by metal as in a grounded gate NMOS (ggNMOS) transistor. This embodiment uses the base potential as the bias signal instead of the source potential, as in the previously described embodiments. During normal operation the bulk substrate is safely grounded and thus disables NMOS operation by keeping the device in the off-state. In case of an ESD event (i.e. positive pulse to the drain 1602 and 1702), the drain-bulk junction of the MOS transistor is driven into avalanche breakdown and holes are injected into the substrate. This hole injection initiates a self-biasing process of the BJT base region which eventually triggers the parasitic NMOS BJT into snapback operation. This positive potential can be used as ESD trigger sensor for the remaining device segments by feeding it to the corresponding gate electrodes 1604 and 1704 via bulk pick-ups 1610 and 1710 in the multi-finger configuration. In this instance, all of the gates and bulk pick-ups 1610 and 1710 are interconnected by a network of metal lines 1614 and 1714 in order to enable a fast propagation of the positive bulk (potential) signal of the triggered finger to all inactive device segments. A polysilicon connection between the single ties may be used to impose a gate delay. The device in FIG. 17 has the substrate pick-ups 1710 on both the drain and the source sides whereas all ties are connected by metal 1714. The ESD devices shown in FIGS. 16 and 17 also include source regions 1606 and 1706.

Figure 18:
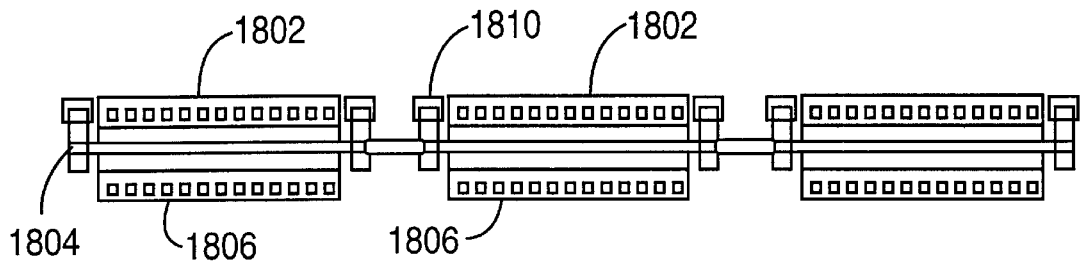
FIG. 18 is a top plan view which shows a device layout of a plurality of parallel connected MFT devices in an in-line arrangement which use a gate-substrate coupling technique.

FIG. 18 shows an alternative arrangement in which a minimum substrate pick-up 1810 is implemented at the drain side 1802. This tie alone is sufficient to bias the gate 1804 of a neighboring finger. Such a structure in an inline arrangement as shown in FIG. 18, could be employed to place the protection device under a bus resulting in a significant savings in silicon real-estate.

FIG. 3 depicts the I–V curve of a 4-finger MFT-NMOS structure. This structure may be any of the exemplary embodiments described above. The triggering voltage $V_{t1}$ reflects the snapback of an (arbitrary) initially triggered finger. Triggering one finger causes the bias signal to turn on the next finger(s). This bias potential is picked up by the neighboring finger. Its snapback turn-on voltage shown in FIG. 3 is reduced to a significantly lower value, $V'_{t1}$, slightly above the holding voltage $V_h$. As soon as the voltage drop across the initially triggered finger reaches this lowered voltage, $V'_{t1}$, the second finger turns on. By the same effect all fingers are triggered successively with increasing current until homogeneous conduction through the entire structures is accomplished.

These exemplary embodiments avoid the homogeneity condition, $V_{t1}<V_{t2}$, of prior-art structures and use a modified homogeneity condition, $V'_{t1}<V_{t2}$. Multi-finger turn-on can be achieved without ballasting or with only a minimum of ballasting (drain-contact-to-gate spacing or back-end-ballasting) resistance. Similarly, the area consumption and parasitic elements associated with such ballasting are avoided. The MFT coupling mechanism relies on static effects only. There are no drawbacks in view of timing and transient interference with normal operation.

Also, this embodiment provides an area efficient implementation of the MFT (Multi-Finger Turn-on) technique using a BEB (Back-End Ballast) technique of the type disclosed in U.S. patent application Ser. No. 09/583,141 file May 30, 2000 entitled "APPARATUS FOR CURRENT BALLASTING ESD SENSITIVE DEVICES" the contents of which are incorporated herein, by reference, in its entirety.

Figure 19:
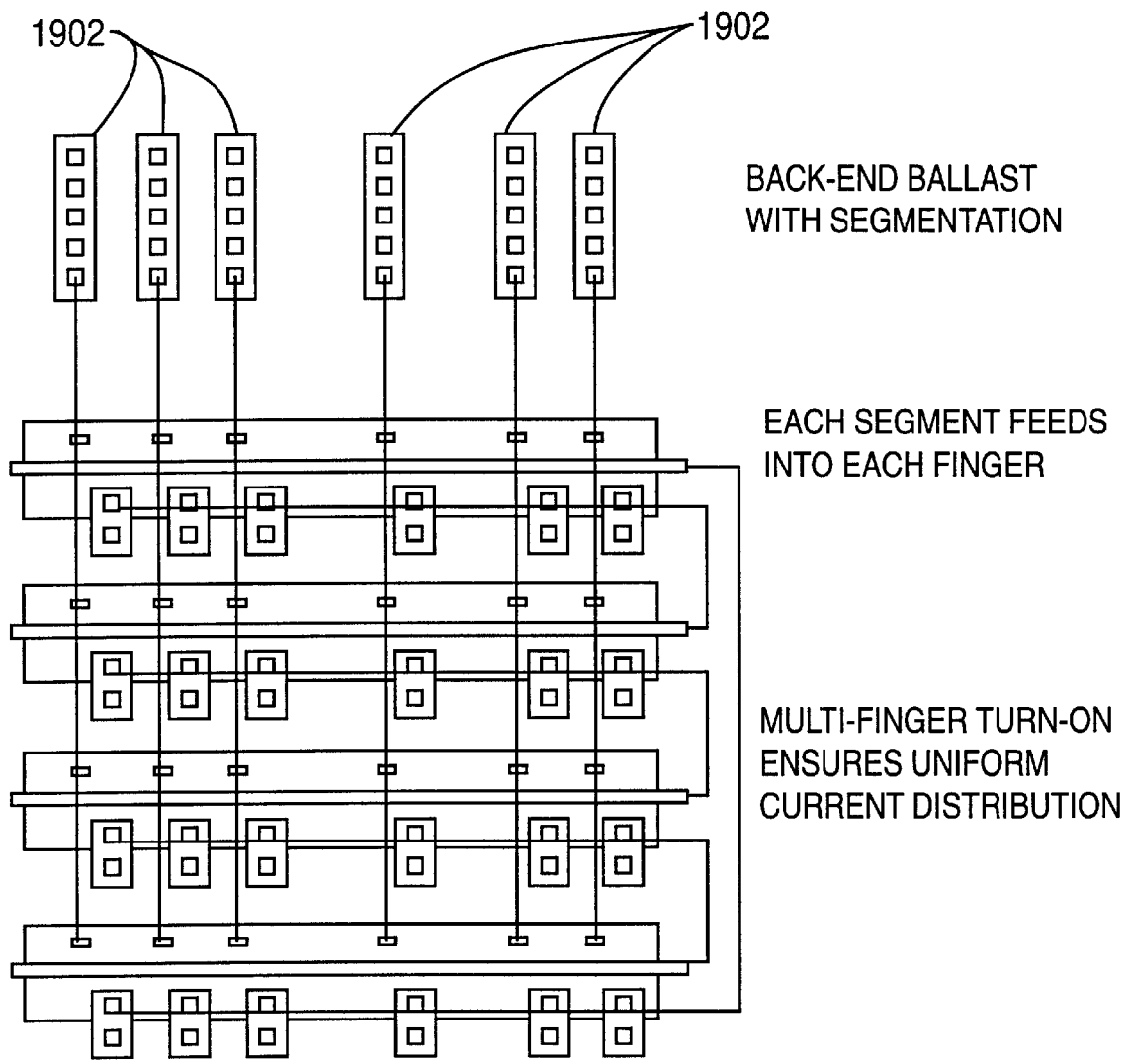
FIG. 19 is a circuit diagram of a back end ballast (BEB) MFT structure.

The BEB block is implemented only once for a set of multiple parallel fingers, generally designated 1902. Each segment is connected to one contact in one finger. The BEB is maintained in every segment and is thus provided just once, instead of each time for each finger. FIG. 19 shows a schematic of the implementation approach.

BEB provides resistance in IC applications. One disadvantage of BEB is that analog and mixed signal designers could not fully use the benefit of fully silicided design cost reduction, because a silicide block is still needed to create polysilicon resistors. However, as can be appreciated, with the use of segmented BEB resistors in these applications this disadvantage is overcome. In the exemplary embodiment, a cascade connection of back-end ballast resistors is used to build the required resistance. The inherent repeatability on-chip of the back-end elements (contacts, vias, polysilicon, metal) allow for proper on-chip matching and scaling of resistance.

As such, these embodiments provide efficient implementation of BEB and MFT and avoid the use of silicide blocking for applications with resistor requirements, such as analog and mixed signal ICs. Those skilled in the art, however, recognize that the BEB and MFT techniques are not limited to silicided or fully silicided circuits.

It is important to note that, as described herein, when segmentation is used, it is maintained and that the actual location of the highest resistance in the segment is not relevant. However, it is important to choose proper ratios for source and drain ballast (which sum up to the total ballast).

Although the ballasting resistors, described above, have been implemented using segmented polysilicon strips, metal strips or vertical meanders of vias and polysilicon or metallization layers, it is contemplated that other methods may be used to form the ballasting resistors.

In addition to using other materials and methods to form the ballasting resistors, the performance and/or size of the ballasting resistors may also be modified as described below with reference to FIGS. 20–27.

FIG. 20 is a top-plan view, partly in schematic diagram form of two single transistor fingers with a ballasting resistor network that can form an MFT, as described above. In this implementation, the ballasting resistor segments of adjacent MOS fingers are entirely separated from each other. Although the ballasting networks in FIGS. 20–27 are shown as being used with a MOS ESD device, it is contemplated that they may be used with other ESD devices, such as those described above.

In this circuit, the first contact terminal 520 is connected to one end of a plurality of ballasting resistors 2002. The other ends of the plurality of ballasting resistors are connected to the drain of the transistor 2004. The transistor 2004 includes a gate electrode 2006. The source of the transistor 2004 is connected to a segmented ballasting resistor which includes resistor segments 2008 and 2012 joined at a connector 2010. This connector may be used, as described above, to connect the source potential of one transistor to the gate or substrate (base) of a parallel transistor.

Figure 22:
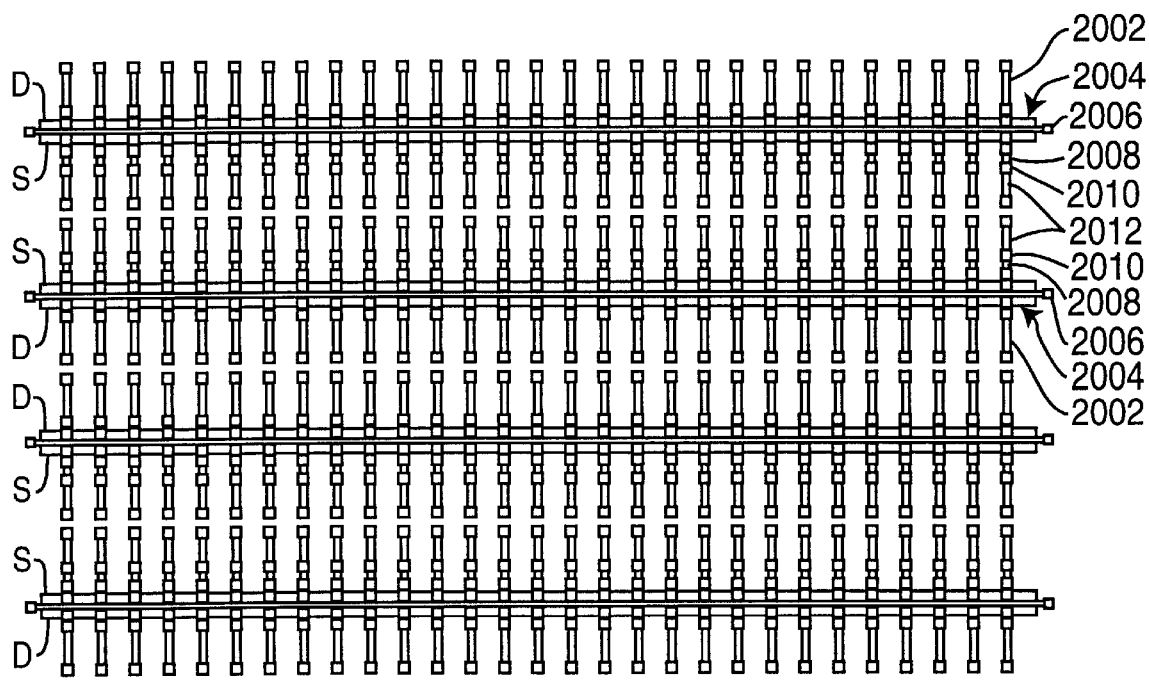
FIG. 22 is a layout diagram of the MFT structure shown in FIG. 20.

FIG. 21 is a schematic diagram for the layout shown in FIG. 20 and FIG. 22 is a layout diagram showing an exemplary ESD device which includes ballasting resistors such as those shown in FIGS. 20 and 21. It is noted that the orientation of the transistors changes from transistor to transistor in the circuit shown in FIG. 22 such that, for the first transistor the drain is above the source in the layout diagram while for the second transistor, the drain is below the source. This configuration allows the ballasting resistors which connect to the source electrodes of the first and second transistors to be connected together and the ballasting resistors which connect to the drain electrodes of the second and third transistors to be connected together. In the exemplary embodiment of the invention, these connections are accomplished using vias (not shown) that connect the ends of the respective ballast resistors to a common electrode (not shown) formed in the metal-2 layer. The connections among the segmented source resistors and the gate and/or substrates of adjacent transistors are made using vias (not shown) that extend to an electrode (not shown) formed in the metal-1 layer.

It is contemplated that the ballasting resistors 2002, 2008 and 2012 may be vertical meander resistors, polysilicon strips, metal strips or even discrete resistors mounted onto connectors formed on the transistors 2004. In addition, it is contemplated that the source resistors may not be segmented or that the source resistors or drain resistors may be eliminated entirely.

An important consideration in current spreading performed by the ballasting resistors is the lateral resistance between the resistors, as described in the above-referenced patent application (09/583,141). One way to increase the lateral resistance is to increase the space between adjacent ballasting resistors. The inventors have determined that, by increasing the space between adjacent ballasting resistors, sufficient space exists to interleave ballast resistors for an adjacent multi-finger transistor structure.

This structure is illustrated in FIGS. 23, 24, 25 and 26A. FIG. 23 is an exemplary circuit layout diagram, partly in schematic diagram form. This layout diagram shows interdigitated source ballasting resistors for two adjacent transistors in an MFT ESD protection device. The circuit shown in FIG. 23 includes drain ballasting resistors 2302 which connect between the first circuit terminal 520 and respective drain contacts on the transistor 2304. Transistor 2304 includes a gate electrode 2306. The circuit shown in FIG. 23 includes segmented source resistors 2308 and 2312 that are joined at a connector 2310. The source resistors 2312 are connected to the second circuit terminal 552. The circuit shown in FIG. 23 also includes a second transistor 2304' having drain ballasting resistors 2302', source ballasting resistors 2308' and 2312' that are joined at connectors 2310'. The source resistors 2312' are connected to the second circuit terminal 552 and the drain resistors 2302' are connected to the first circuit terminal 520' and 520. It is noted that the source resistors 2308 and 2312 and their associated connector 2310 are interleaved with the source resistors 2308'; and 2312' and connector 2310'. In the exemplary layout shown in FIG. 23, the source resistors 2312 and 2312' are connected to each other and to the second circuit terminal 552 and 552' using vias (not shown) that extend to an electrode (not shown) formed in a higher metal layer (e.g. metal-1 or metal-2). Connections (not shown) between the connectors 2310 and the gate electrode 2306' of transistor 2304' may be made using vias (not shown) that extend to an electrode (not shown) formed in a higher metal layer.

Figure 24:
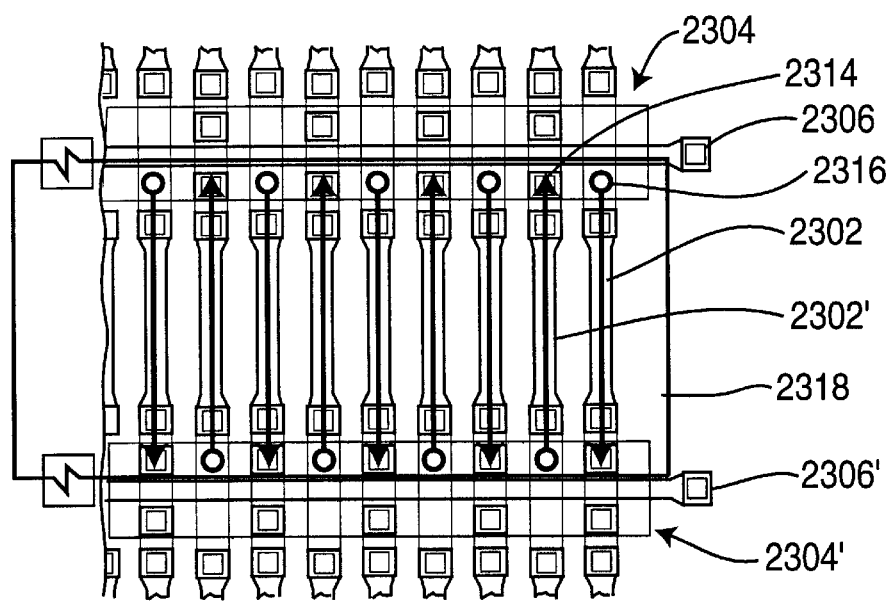
FIG. 24 is a layout diagram which is useful for describing the MFT structure shown in FIG. 23.

FIG. 24 is a layout diagram which shows a portion of an ESD circuit such as that shown in FIG. 23. FIG. 24 shows two transistors 2304 and 2304' and their drain ballasting resistors 2302 and 2302'. The arrows superimposed on the ballasting resistors indicate their connectivity. The round end of the arrow represents a via that connects to an electrode 2318, formed in the metal-2 layer. The pointed end of the arrow indicates a connection to the respective drain portions of the transistors 2304 and 2304'. As shown in FIG. 24, the ends of the ballasting resistors 2302 and 2302' that are away from the drain portions of their respective transistors are connected together via the electrode 2318. The portions of the resistors connected to the drain portions form parallel channels which exhibit a ballasting resistance. A lateral resistance is formed between two adjacent drain contacts on either transistor 2304 or 2304'. Because the end of the ballasting resistor between the two drain contacts extends up through the via to the electrode 2318, it has little or no effect on the lateral resistance.

Figure 25:
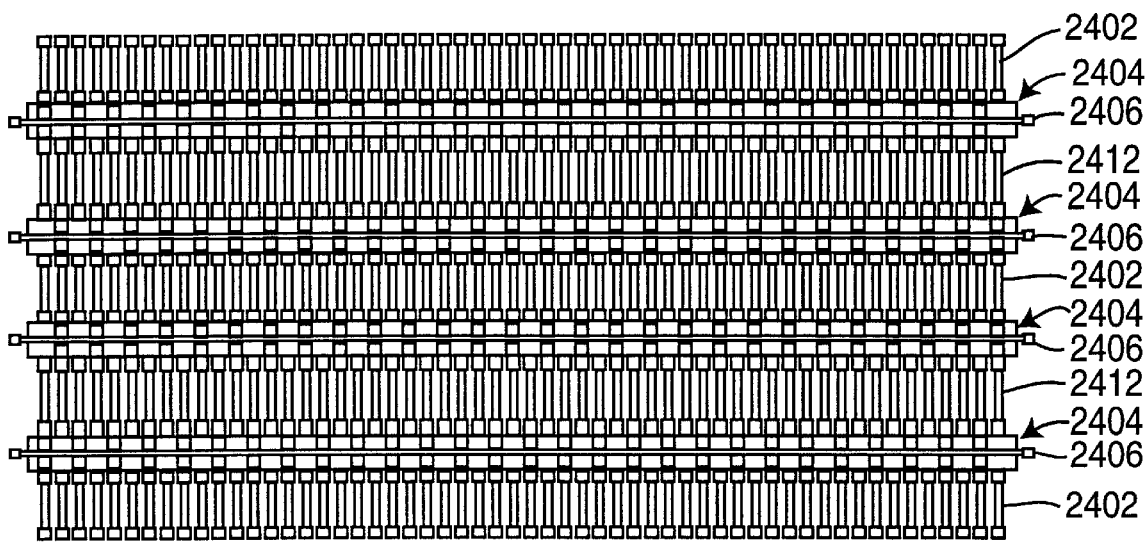
FIG. 25 is a layout diagram of the MFT structure shown in FIGS. 23.
Figure 26A:
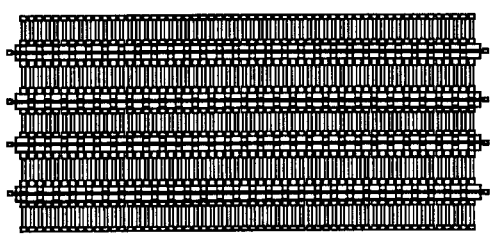
FIGS. 26A and 26B are layout diagrams showing a comparison of the MFT structures shown in FIGS. 20 and 23.

FIG. 25 is a layout diagram that is a magnified version of FIG. 26A. FIG. 25 shows a four-transistor ESD circuit having interleaved ballasting resistors. Although a full set of drain ballasting resistors are shown at the top and bottom of the layout diagram, only one-half of these resistors are actually used in a four-transistor circuit. The circuit shown in FIG. 25 may be simplified by eliminating alternate ones of the drain ballasting resistors 2402 at the top and bottom of the layout diagram.

Figure 26B:
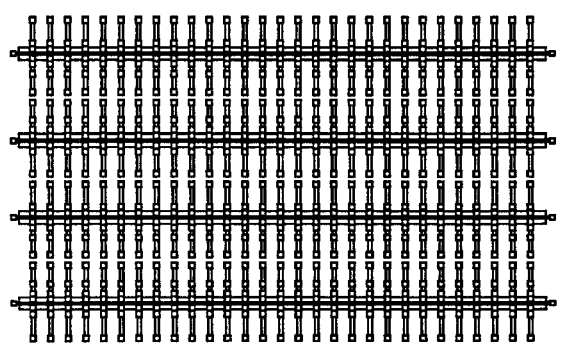

FIGS. 26A and 26B show a comparison of ESD ballasting arrangements formed as described above with reference to FIGS. 23 and 20, respectively. The circuits are equivalent except that the source resistors and the drain resistors for adjacent transistors are interleaved in FIG. 26A but not in FIG. 26B. As can be seen, the interleaving of the resistors reduces the area occupied by the ESD device of FIG. 23 by 30 percent relative to the ESD device of FIG. 20.

Figure 27A:
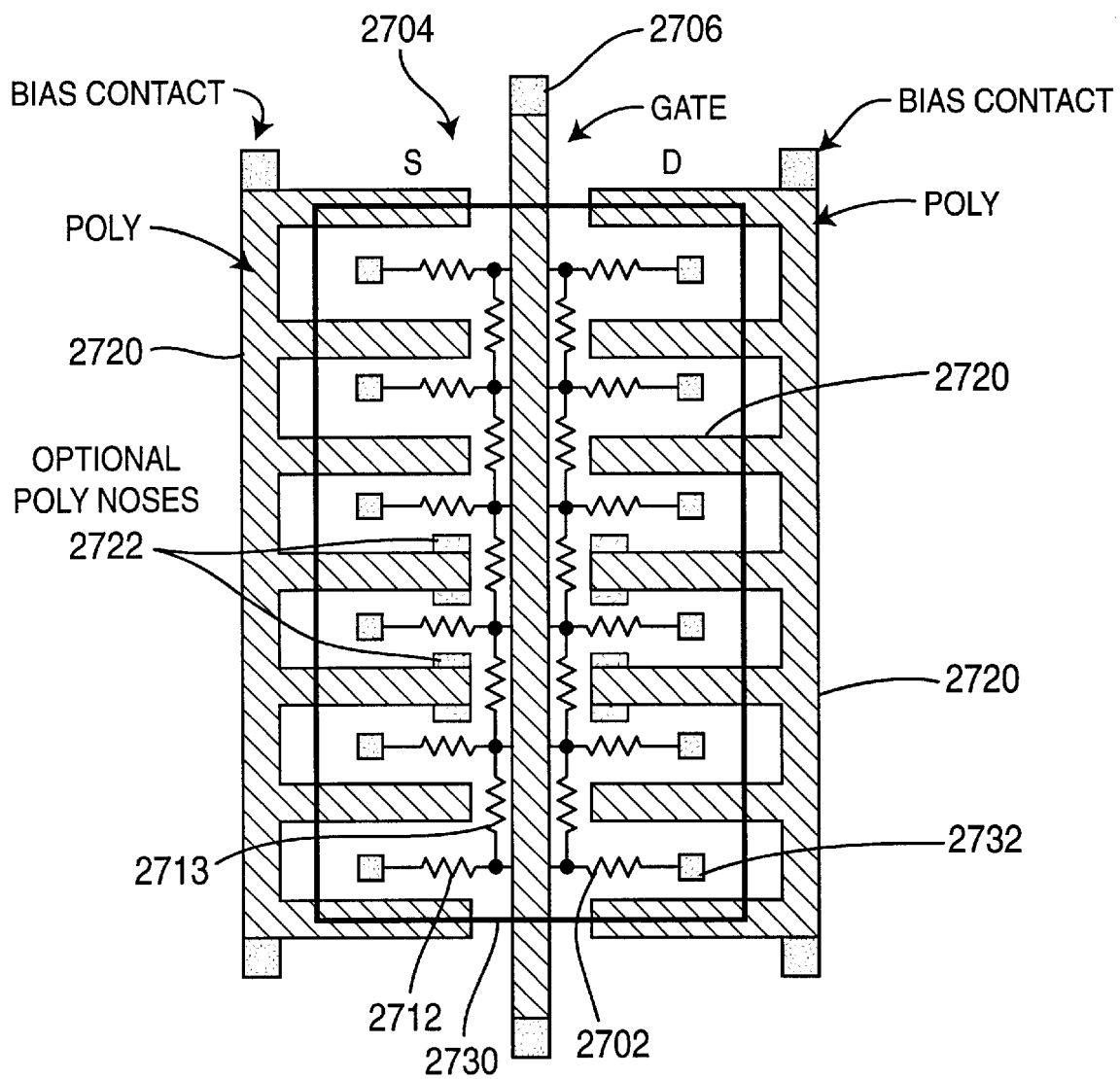
FIG. 27A is a top-plan view, partly in schematic diagram form, of an exemplary ESD protection device.
Figure 27B:
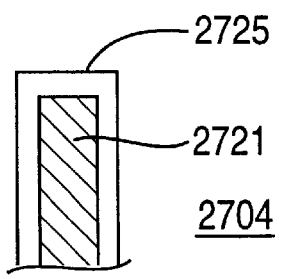
FIG. 27B is a top plan view of a portion of the ESD protection device shown in FIG. 27A.

FIGS. 27A and 27B are layout diagrams which illustrate another exemplary ballasting resistance structure. In this structure, the ballasting resistors are formed in the N+ active region 2730 of the transistor 2704. The structure shown in FIG. 27A may be made by forming a patterned polysilicon layer 2720 (shown in FIG. 27B) on a silicon substrate. The patterned polysilicon layer may not touch the gate electrode 2706 of the transistor 2704. Next, the N+ region 2730 is formed by implanting or depositing and diffusing an N-type dopant in the region 2730. The polysilicon electrodes 2706 and 2720 and the underlying oxide layers 2725 block the N-type dopant, so the active region 2730 includes fingers of N+ material formed in the P-type substrate. Next, silicide is formed over the entire surface.

Because of the well-known gate oxide spacer deposition, no silicide forms on the region of the oxide layer 2725 that extends beyond the polysilicon, the electrodes 2720 and 2706 are insulated from the N+ active region 2730. Next, electrodes 2732 are formed in the silicided N+ fingers that extend on the source and drain sides of the transistor 2704. These electrodes connect through vias to electrodes (not shown) formed, for example, in the metal-1 layer which are the first circuit electrode 520 and second circuit electrode 522, respectively. Electrode structures may also be formed on the polysilicon electrodes 2720 that are used to apply a bias potential to the electrodes. In the exemplary embodiment of the invention, these electrodes may be connected to a source of reference potential (e.g. ground) through vias that connect to an electrode structure, for example, in the metal-2 layer.

The source and/or drain resistances may be further enhanced by implementing the "noses" 2722 at the ends of the fingers of the polysilicon structures 2720. The N+ regions are pinched off by these polysilicon noses 2722, further increasing the source/drain resistances.

Although the device is shown as being implemented as N-type fingers formed in a P-type substrate, it is contemplated that an equivalent device may be formed using P-type fingers in an N-type substrate, N-type fingers in a P-well, or P-type fingers in an N-well.

Because each of the N-type fingers defined by the electrode structures 2720 are separated by P-type regions beneath the electrode structures, each of these fingers acts as a ballasted finger. The exemplary embodiment of the invention includes drain resistors 2702 and source resistors 2712. In addition, the portions of the N+ region 2730 between adjacent N+ fingers form lateral resistors 2713. As described above, these lateral resistors aid in spreading the current to ensure that ESD current does not concentrate in any one segment of the ESD device finger. The ESD device shown in FIG. 27A may be, for example, a ggMOS-type device. It is contemplated that other types of ESD devices, as described above may be implemented using the ballasting resistors shown in FIG. 27A.

It will be understood that various changes in the details, materials, and arrangements of the parts which have been described and illustrated above in order to explain the nature of this invention may be made by those skilled in the art without departing from the principle and scope of the invention as recited in the following claims.

What is claimed is:

1. A multi-finger ESD protection circuit, for protecting a circuit terminal from an ESD event, the protection circuit comprising:

at least first and second field effect transistors (FETs), each of the first and second FETs having a drain region, a source region and a gate electrode, the drain regions of the first and second FETs being coupled to the circuit terminal, the gate electrode of the second FET being coupled to the source region of the first FET; and at least two source resistive channels connected between a corresponding one of the source regions of the first and second FETs and a source of reference potential.

2. A multi-finger ESD protection circuit according to claim 1, wherein the at least first and second FETs include first, second and last FETs, the last FET having a gate electrode and source and drain regions, and the at least two source resistive channels include first, second and last source resistive channels, the drain region of the last FET being coupled to the circuit terminal and the last source resistive channel being coupled between the source region of the last FET and the source of reference potential, wherein the gate electrode of the first FET is coupled to the source region of the last FET.

3. A multi-finger ESD protection circuit according to claim 2, further including at least first, second and last drain resistive channels, the first, second and last drain resistive channels being coupled between the circuit terminal and the respective drain regions of the first, second and last FETs.

4. A multi-finger ESD protection circuit according to claim 3, wherein at least one of the source resistive channels and the drain resistive channels includes polysilicon.

5. A multi-finger ESD protection circuit according to claim 3, wherein the circuit is formed on a semiconductor substrate and at least one of the source resistive channels and the drain resistive channels is formed of an interconnection of metal layers and vias.

6. A multi-finger ESD protection circuit according to claim 1, wherein the circuit is formed on a semiconductor substrate such that the source regions of the first and second FETs are opposed and are separated by a plurality of the source resistive channels, wherein the source resistive channels coupled to the first FET are interleaved with the source resistive channels coupled to the second FET.

7. A multi-finger ESD protection circuit according to claim 3, wherein the circuit is formed on a semiconductor substrate and at least one of the source resistive channels and the drain resistive channels for the first transistor are formed from fingers of active semiconductor material of a first type which forms the source and drain regions of the first FET separated by regions of active semiconductor material of a second type, opposite to the first type.

8. A multi-finger ESD protection circuit, comprising:
(a) first and second circuit terminals;
(b) at least two resistive channels defining input fingers connected to the first circuit terminal;
(c) at least first and second field effect transistors (FETs), each of the at least first and second FETs having a drain region, a source region and a gate electrode, the drain regions of the first and second FETs being connected to respective ones of the at least two resistive channels;
(d) a first resistive element connected between the source region of the first FET and the second circuit terminal;
(e) a second resistive element connected between the source region of the second FET and the second circuit terminal; and
(f) a biasing transistor having source, gate and drain terminals, the source terminal of the biasing transistor being connected to the gate electrodes of the first and second FETs, the gate terminal of the biasing transistor being connected to the source region of the first FET and the drain terminal of the biasing transistor being connected to the first circuit terminal.

9. A multi-finger ESD protection circuit according to claim 8, further comprising:
(g) A diode having anode and cathode terminals, the anode terminal being connected to the source terminal of the biasing transistor and cathode terminal being connected to the second circuit terminal.

10. A multi-finger ESD protection circuit according to claim 9, wherein the diode is a Schottky diode.

11. A multi-finger ESD protection circuit according to claim 9, further comprising:
(h) at least one resistor connected between the gate electrodes of the first and second FETs and the second circuit terminal.

12. A multi-finger ESD protection circuit according to claim 8 wherein the at least one of the two resistive channels, the first resistive element and the second resistive element includes polysilicon.

13. A multi-finger ESD protection circuit according to claim 8, wherein the circuit is formed on a semiconductor substrate and at least one of the two resistive channels, the first resistive element and the second resistive element is formed from an interconnection of conductive layers and vias.

14. A multi-finger ESD protection circuit according to claim 8, wherein the circuit is formed on a semiconductor substrate such that the source regions of the first and second FETs are opposed and are separated by a plurality of further resistive channels that form the first resistive element and the second resistive element, wherein the further resistive channels that form the first resistive element are coupled to the first FET and are interleaved with the further resistive channels that form the second resistive element and that are coupled to the second FET.

15. A multi-finger ESD protection circuit according to claim 8, wherein the circuit is formed on a semiconductor substrate and the further resistive channels for the first transistor are formed from fingers of active semiconductor material of a first type which forms the source region of the first FET separated by regions of active semiconductor material of a second type, opposite to the first type.

16. A multi-finger ESD protection circuit, comprising:
(a) first and second circuit terminals;
(b) a plurality of first resistive channels having first and second ends, the first ends of the plurality of first resistive channels being connected to the first circuit terminal, the plurality of first resistive channels defining a respective plurality of input fingers;
(c) a plurality of field effect transistors (FETs), each of the plurality of field effect transistor having a drain, source and gate terminal, the gate terminals of the plurality of field effect transistors being connected together, the drain terminals of the plurality of field effect transistors being connected to the second ends of the plurality of input fingers, respectively;
(d) a plurality of second resistive channels being connected between respective ones of the source terminals of the plurality of FETs and the second circuit terminal;
(e) a plurality of biasing transistors, each having drain, source and gate terminals, the gate terminals of the plurality of biasing transistors being connected to the source terminals of the plurality of field effect transistors, respectively, the source terminals of the plurality of biasing transistors being connected to the second circuit terminal, and the drain terminals of the plurality of biasing transistors being connected together;

(f) a further biasing transistor, having source, gate and drain terminals, the source terminal of the further biasing transistor being coupled to the first circuit terminal, the gate terminal of the further biasing transistor being coupled to the connected drain terminals of the plurality of biasing transistors and the drain terminal of the further biasing transistor being coupled to the connected gate terminals of the plurality of FETs; and (g) at least one resistor connected between the first circuit terminal and the connected drain terminals of the plurality of biasing transistors.

17. A multi-finger ESD protection circuit according to claim 16, further comprising:

(h) a diode having anode and cathode terminals, the anode terminal being coupled to the connected gate terminals of the plurality of FETs and the cathode terminal being connected to the source of reference potential.

18. A multi-finger ESD protection circuit according to claim 16 wherein at least one of the first and second resistive channels includes polysilicon.

19. A multi-finger ESD protection circuit according to claim 16, wherein the circuit is formed on a semiconductor substrate and at least one of the first and second resistive channels is formed of an interconnection of conductive layers and vias.

20. A multi-finger ESD protection circuit according to claim 16, wherein the circuit is formed on a semiconductor substrate such that the source terminals of the first and second FETs are opposed and are separated by a plurality of the second resistive channels, wherein the second resistive channels coupled to the first FET are interleaved with the second resistive channels coupled to the second FET.

21. A multi-finger ESD protection circuit according to claim 16, wherein the circuit is formed on a semiconductor substrate and the second resistive channels for the first transistor are formed from fingers of active semiconductor material of a first type, which forms the source terminal of the first FET, separated by regions of active semiconductor material of a second type, opposite to the first type.

22. A multi-finger ESD protection circuit, comprising:

(a) first and second circuit terminals;

(b) at least two first resistive channels, connected at one end to the first circuit terminal, the at least two first resistive channels defining respective input fingers;

(c) at least two field effect transistors (FETs), each of the at least two FETs having drain and source regions and a gate electrode, the drain regions of the at least two FETs being connected to respective ones of the at least two input fingers, the gate electrode of the at least two FETs being connected together;

(d) at least two diodes, each having anode and cathode terminals, the anode terminal of each of the at least two diodes being connected to the source region of a respective one of the at least two FETs, the cathode terminals being connected to each other and to the connected gate electrodes;

(e) at least one resistor connected between the second circuit terminal and the connected diode cathode terminals; and (f) at least two second resistive channels connected between respective ones of the source regions of the at least two FETs and the second circuit terminal.

23. A multi-finger ESD protection circuit according to claim 22 wherein at least one of the and second first resistive channels includes polysilicon.

24. A multi-finger ESD protection circuit according to claim 22, wherein the circuit is formed on a semiconductor substrate and at least one of the first and second resistive channels is formed of an interconnection of conductive layers and vias.

25. A multi-finger ESD protection circuit according to claim 22, wherein the circuit is formed on a semiconductor substrate such that the source regions of the first and second FETs are opposed and are separated by a plurality of the second resistive channels, wherein the second resistive channels coupled to the first FET are interleaved with the second resistive channels coupled to the second FET.

26. A multi-finger ESD protection circuit according to claim 22, wherein the circuit is formed on a semiconductor substrate and at least one of the first and second resistive channels for the first transistor is formed from fingers of active semiconductor material of a first type which forms the source and drain regions of the first FET separated by regions of active semiconductor material of a second type, opposite to the first type.

27. A multi-finger ESD protection circuit for conducting ESD currents from a first circuit terminal to a second circuit terminal, comprising:

(a) a triggering circuit for detecting an ESD event and producing a detection signal;

(b) a transfer circuit responsive to the detection signal of the triggering circuit for producing a bias signal; and (c) a multi-finger turn-on transistor (MFT) circuit including a plurality of field effect transistors FETs, each FET having a drain electrode coupled to the first circuit terminal, a source electrode coupled to the second circuit terminal and a gate electrode, coupled to the gate electrodes of the plurality of FETs and coupled to receive the bias signal, the MFT circuit being responsive to the bias signal for channeling an electro-static discharge current through the plurality of FETs.

28. A multi-finger ESD protection circuit according to claim 27, wherein the triggering circuit includes:

(i) a trigger resistive element coupled to the first circuit terminal;

(ii) a trigger transistor, the trigger transistor having a channel and source, gate and drain terminals, the drain terminal being coupled to the trigger resistive element, and the gate terminal being coupled to the channel of the trigger transistor; and (iii) a driver resistive element coupled between the source terminal of the trigger transistor and the second circuit terminal.

29. A multi-finger ESD protection circuit according to claim 27, wherein the transfer circuit includes:

(i) a first field effect transistor, the first field effect transistor having drain, gate and source terminals, the source terminal being coupled to the second circuit terminal, the gate terminal being coupled to the source terminal of the trigger transistor, and (ii) a second field effect transistor, the second field effect transistor having drain, gate and source terminals, the gate terminal of the second field effect transistor being coupled to the drain terminal of the first field effect transistor, the source terminal of the second field effect transistor being coupled to the first circuit terminal, and the drain terminal of the second field effect transistor being coupled to the connected gate electrodes of the MFT circuit.

30. A multi-finger ESD protection circuit according to claim 27, wherein the MFT includes:

a plurality of resistive channels having first and second ends, the first ends being connected;

a plurality of field effect transistors (FETs), each having gate, source and drain electrodes, the drain electrodes of the FETs being connected to respective ones of the second ends of the plurality of resistive channels and the gate electrodes of the plurality of FETs being connected;

a diode having anode and cathode terminals, the anode terminal being coupled to the first terminal and the cathode terminal being coupled to the connected first ends of the plurality of resistive channels; and a resistor having a first end coupled to the anode of the diode and a second end coupled to the cathode of the diode.

31. A multi-finger ESD protection circuit according to claim 30, wherein the MFT further includes a further FET having source, gate and drain terminals, the drain terminal being connected to the first circuit terminal, the source terminal being connected to the cathode terminal of the diode and the gate terminal being connected to a source of reference potential.

32. A multi-finger ESD protection circuit, comprising:
(a) first and second circuit terminals;
(b) a triggering circuit, coupled to the first circuit terminal, for detecting an ESD event and producing a detection signal;
(c) a multi-finger turn-on transistor (MFT) circuit, including a plurality of parallel ESD discharge paths coupled between the first and second circuit terminals, each of the parallel ESD discharge paths being responsive to the detection signal for channeling an electro-static discharge from the first circuit terminal to the second circuit terminal.

33. A multi-finger ESD protection circuit according to claim 32 wherein the triggering circuit includes:
(i) a trigger resistive element connected to the first circuit terminal;
(ii) a trigger transistor, the trigger transistor having a channel and source, gate and drain terminals, the drain terminal being connected to the trigger resistive element, and the gate terminal being connected to the channel of the trigger transistor; and
(iii) a driver resistive element having first and second ends, the first end being coupled to the source terminal of the trigger transistor and to the plurality of parallel discharge paths, and the second end of the driver resistive element being connected to the second circuit terminal.

34. A multi-fingered ESD protection circuit comprising:
(a) a plurality of field effect transistors (FETs) each having a gate electrode, a drain region, a source region and a channel region, each FET forming a parasitic bipolar transistor having a collector region corresponding to the drain region, a base region corresponding to the channel region and an emitter region corresponding to the source region, and each FET having a plurality of parallel electrical contacts on at least one of the drain region and the source region to define a plurality of parallel discharge channels; and
(b) a connector which couples the gate electrodes and the channel regions of the plurality of FETs.

35. A multi-finger ESD protection circuit, comprising:
first and second circuit terminals;
at least first, second and third field effect transistors (FETs), each of FETs having a drain region, a source region and a gate electrode, the first, second and third FETs being configured such that the source regions of the first and second FETs are opposed and the drain regions of the second and third FETs are opposed; and a plurality of first resistive channels having first and second ends, the first ends being connected to the second circuit terminal and the second ends being coupled to the source regions of the first and second FETs, the plurality of first resistive channels being configured between the opposed source regions of the first and second FETs such that the first resistive channels coupled to the source region of the first FET are interleaved among the first resistive channels coupled to the source region of the second FET; and a plurality of second resistive channels having first and second ends, the first ends being connected to the first circuit terminal and the second ends being coupled to the drain regions of the second and third FETs, the plurality of second resistive channels being configured between the opposed drain regions of the second and third FETs such that the second resistive channels coupled to the drain region of the second FET are interleaved among the second resistive channels coupled to the drain region of the third FET.

36. A multi-finger ESD protection circuit comprising:
a field effect transistor (FET) including a source active semiconductor region of a first type formed within a substrate of a second type and a drain active semiconductor region of the first type formed within the substrate and being separated from the source active semiconductor region by a channel region of the second type and a gate electrode, substantially coextensive with and separated from the channel region by a dielectric layer;

wherein at least one of the source active semiconductor region and the drain active semiconductor region includes a plurality of fingers of the semiconductor region of the first type separated by respective regions of the substrate, each of the fingers forming a respective ballasting resistance for the at least one of the source region and drain region of the FET.

37. A multi-finger ESD protection circuit according to claim 36, further comprising a biasing electrode, formed substantially coextensive with the regions of the substrate that separate the fingers of the semiconductor region of the first type and insulated from the substrate.

38. A multi-fingered ESD protection circuit according to claim 37, wherein the biasing electrode and the plurality of fingers of the semiconductor region of the first type include silicide.

39. A circuit for protecting a circuit terminal from an ESD event, comprising:
a plurality of transistor fingers coupled between the first circuit terminal and a source of reference potential; and
means for interconnecting the plurality of transistor fingers, wherein, when a first one of the plurality of transistor fingers triggers, at least a second one of the plurality of transistor fingers is turned-on by a bias signal generated by the first one of the plurality of transistor fingers.

40. A circuit according to claim 39, wherein:
each of the plurality of transistor fingers includes a field effect transistor (FET), having a source and drain regions, a channel region and a gate electrode, and a source resistance coupled between the source region of the FET and the source of reference potential; and the means for interconnecting the plurality of transistor fingers includes means for coupling the source region of the first one of the plurality of transistor fingers to the channel region of the second one of the plurality of transistor fingers.

41. A circuit according to claim 40, wherein the means for interconnecting the plurality of transistor fingers further includes means for connecting the source region of the first one of the plurality of transistor fingers to the gate electrode of the second one of the plurality of transistor fingers.

42. A circuit for protecting a circuit terminal from an ESD event, comprising:

- a plurality of resistive elements having a first end and a second end, the first end being coupled to the circuit terminal;
- at least two transistor fingers, each of the at least two transistor fingers including a plurality of first electrodes, each of the first electrodes of each of the at least two transistor fingers being coupled to a respective first electrode of the other ones of the at least two transistor fingers and to the second end of a respectively different one of the plurality of resistive elements, and a plurality of second electrodes, each of the second electrodes being coupled to a source of reference potential; and
- means for interconnecting the plurality of transistor fingers, wherein, when a first one of the plurality of transistor fingers triggers, at least a second one of the plurality of transistor fingers is turned-on by a bias signal generated by the first one of the plurality of transistor fingers.

43. A circuit for protecting a circuit terminal from an ESD event, comprising:

- a plurality of resistive elements having a first end and a second end, the first end being coupled to a source of reference potential;
- at least two transistor fingers, each of the at least two transistor fingers including a plurality of first electrodes coupled to the circuit terminal and a plurality of second electrodes, each of the second electrodes of each of the at least two transistor fingers being coupled to a respective second electrode of the other ones of the at least two transistor fingers and to the second end of a respectively different one of the plurality of resistive elements; and
- means for interconnecting the plurality of transistor fingers, wherein, when a first one of the at least two transistor fingers triggers, at least a second one of the at least two transistor fingers is turned-on by a bias signal generated by the first one of the at least two transistor fingers.

* * * * *